(12) United States Patent
Abe et al.

(10) Patent No.: US 6,624,034 B2
(45) Date of Patent: Sep. 23, 2003

(54) METHOD OF MAKING FIELD EFFECT TRANSISTOR IN WHICH THE INCREASE OF PARASITIC CAPACITANCE IS RESTRAINED BY SCALE REDUCTION

(75) Inventors: Yuji Abe, Hyogo (JP); Naruhisa Miura, Hyogo (JP); Kohei Sugihara, Hyogo (JP); Toshiyuki Oishi, Hyogo (JP); Yasunori Tokuda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/173,835

(22) Filed: Jun. 19, 2002

(65) Prior Publication Data

US 2002/0158292 A1 Oct. 31, 2002

Related U.S. Application Data

(62) Division of application No. 09/735,656, filed on Dec. 14, 2000.

(30) Foreign Application Priority Data

Jul. 27, 2000 (JP) ......................................... 2000-226956

(51) Int. Cl.$^7$ ............................................. H01L 21/336
(52) U.S. Cl. ..................... 438/300; 438/305; 438/366; 438/231
(58) Field of Search ................................. 438/366, 300, 438/231, 545, 305, 595, 368, 228, 227, 223, 154, 563, 199, 224, 232, 306; 257/368, 344, 607, 336, 338, 339

(56) References Cited

U.S. PATENT DOCUMENTS

| 5,514,902 A | 5/1996 | Kawasaki et al. | |
|---|---|---|---|
| 5,796,145 A | 8/1998 | Sato | |
| 5,851,866 A | * 12/1998 | Son | 438/231 |
| 5,902,125 A | * 5/1999 | Wu | 438/300 |
| 5,972,762 A | * 10/1999 | Wu | 438/305 |
| 6,064,096 A | 5/2000 | Son | |
| 6,087,234 A | * 7/2000 | Wu | 438/299 |
| 6,163,057 A | 12/2000 | Okamura | |
| 6,436,783 B1 | * 8/2002 | Ono et al. | 438/366 |

OTHER PUBLICATIONS

Okamura et al., "Source–To–Drain Nonuniformly Doped Channel (NUDC) MOSFET Structures For High Current Drivability And Threshold Voltage Controllability", IEEE Transactions on Electron Devices, vol. 39, No. 11, Nov. 1992, pp. 2541–2552.

* cited by examiner

*Primary Examiner*—David Nelms
*Assistant Examiner*—Long Tran
(74) *Attorney, Agent, or Firm*—Leydig, Voit & Mayer, Ltd.

(57) ABSTRACT

A method of producing a semiconductor device includes forming a gate electrode on a channel region on a surface of a semiconductor region of a semiconductor substrate, the channel region having a depth in the semiconductor substrate; forming a first pair of side wall spacers on opposite sides of the gate electrode; forming elevated semiconductor layers, each elevated semiconductor layer being elevated relative to the channel region, on regions outside of the pair of side wall spacers and in which source and drain regions of a first conductivity type are to be formed; removing the pair of first side wall spacers; and forming a pair of pocket injection regions of a second conductivity type by introducing, after the side wall spacers are removed, a dopant impurity producing the second conductivity type deeper in the semiconductor substrate than a region where the side wall spacers were formed, the pair of pocket injection regions respectively covering only a neighborhood of respective side surface parts of the channel region, where the source and drain regions are to be formed, forming respective pn junctions only between the neighborhood of the side surface parts and the pocket injection regions.

13 Claims, 14 Drawing Sheets ial effect and a production method thereof. More specifically, it
METHOD OF MAKING FIELD EFFECT TRANSISTOR IN WHICH THE INCREASE OF PARASITIC CAPACITANCE IS RESTRAINED BY SCALE REDUCTION This application is a division of application Ser. No. 09/735,656 filed Dec. 14, 2000.

BACKGROUND OF THE INVENTION

1. Field of the Invention

The present invention relates to a semiconductor device of MIS (metal insulator semiconductor) type using a :field effect and a production method thereof. More specifically, it relates to a semiconductor device in which the increase of parasitic capacitance is restrained while restraining punch-through and other effects generated by scale reduction, and a production method thereof.

2. Description of the Background Art

In order to provide a CMOS (complementary metal oxide semiconductor) having a higher performance, improvement of intrinsic performance by scale reduction is needed. Disadvantages accompanying the scale reduction include punch-through, the short channel effect, and other effects. In order to restrain punch-through and the short channel effect, a method is proposed in which the source/drain regions of first conductivity type are covered with a second conductivity type impurity region so that the source/drain regions may not directly face the channel region (Y. Okumura et. al., IEEE Trans. Electron Devices, vol. 39, No. 11, p. 9541 (1992)).

Referring to FIG. 28, in the semiconductor device disclosed in the aforesaid document by Okumura et al., a channel region 106 is disposed in a p-well 102 in a p-type silicon substrate 101. An extension region 105 extending from the source/drain regions 104 is covered with a p-type impurity region 103 so that the extension region 105 may not directly face the channel region 106. In the following descriptions, the p-type impurity region 103 will be referred to as a pocket injection region; however, in the aforesaid document, the p-type impurity region 103 is referred to as NUDC (non-uniformly doped channel) layer. A gate electrode 108 is formed on the channel region 106 with an intervening gate dielectric film 107.

If the above-mentioned pocket injection region 103 is not present, a junction is formed between the source/drain regions 104 of the n-type impurity region and the p-type well 102, 50 that when a reverse bias voltage is applied, a depletion layer extends to the p-well side, having a low impurity concentration. In other words, as the reverse bias voltage increases, the depletion layer extends towards the aforesaid channel region 106 and, depending on the degree of scale reduction of the channel length, punch-through occurs easily. If the p-type impurity concentration of the pocket injection region 103 is increased, the extension of the depletion layer towards the pocket injection region side is restrained. Therefore, by increasing the p-type impurity concentration of the pocket injection region 103, the extension of the depletion layer, which is generated in the junction formed between the source/drain regions 104 of the n-type impurity region and the p-type well 102, to the channel region 106 side can be prevented. This restrain t of the extension of the depletion layer acts effectively as a restraint of punch-through and a restraint of the short channel effect. As a result of this, scale reduction of semiconductor devices such as CMOS can be achieved without raising problems such as punch-through.

However, as shown in FIG. 28, the pocket injection region into which an impurity has been injected, i.e., ion implanted, is in contact with a bottom surface 109 of the source/drain regions over a wide range. A junction capacitance is generated at the junction of the p-type pocket injection region and the n-type source/drain regions. This junction capacitance is proportional to the area of the junction and increases as the junction becomes wider. Further, if the p-type impurity concentration of the pocket injection region is increased, the junction capacitance increases due to the decrease in the width of the depletion layer and due to the impurity concentration itself. If the junction capacitance increases, the operational characteristics of the semiconductor device deteriorate and the switching speed decreases. For this reason, there are cases in which the impurity concentration of the pocket injection region cannot be increased to a suitable level in an attempt to restrain punch-through and other effects. Scale reduction of the semiconductor devices is a perpetual goal to be achieved, and there is a need to solve these obstacles to scale reduction.

SUMMARY OF THE INVENTION

Thus, an object of the present invention is to provide a semiconductor device that makes it possible to restrain the increase of the junction capacitance and others while preventing the punch-through and others accompanying the scale reduction, and a production method thereof.

A semiconductor device of the present invention includes source and drain regions of first conductivity type disposed to sandwich a channel region located in a surface part of a semiconductor layer, and a pair of pocket injection regions of second conductivity type that cover only a neighborhood of respective side surface parts of the source and drain regions on the channel region side and form a junction only between the neighborhood of the side surface parts and the pocket injection regions.

In the above construction, the pocket injection regions and the source/drain regions form a junction at the aforesaid side surface to be in an electrically conducted state, and the pocket injection regions having a raised impurity concentration of second conductivity type restrain the extension of the depletion layer from the aforesaid junction to the pocket injection regions. For this reason, the punch-through, the short channel effect, and others accompanying the scale reduction of semiconductor devices can be restrained. Further, as described above, since the junction is limited to the side surface of the source/drain regions, the area of the junction will be extremely small as compared with the conventional semiconductor devices. Therefore, the increase of the junction capacitance, which increases in proportion to the area of the junction, is restrained, thereby preventing the deterioration of the operation characteristics and the decrease of the switching speed of the semiconductor device. As a result of this, the increase of the junction capacitance parasitic to the junction between the pocket injection regions and the source/drain regions can be restrained while preventing the punch-through, the short channel effect, and others accompanying the scale reduction of semiconductor devices.

In the aforesaid semiconductor device of the present invention, the source and drain regions include source extension and drain extension regions of first conductivity type that extend towards the channel region, and each of the pocket injection regions covers a side surface and a bottom surface of the source extension and drain extension regions on the channel region side to form a junction.

If the extension regions are formed in the source/drain regions, the pocket injection regions cover, from the lower side, the whole of the extension regions from the channel region side to the bottom surface to form a junction so that the surface of the extension regions may not be exposed to the channel region. Therefore, the extension of the depletion layer to the pocket injection region can be prevented by increasing the second conductivity type impurity concentration in the pocket injection regions. Since the extension regions are formed in an extremely limited range as compared with the source/drain regions, the area of the junction does not increase even if the whole of the extension regions that are exposed to the channel region is covered. Therefore, the increase of the junction capacitance is restrained, thereby preventing the deterioration of the operation characteristics and the decrease of the switching speed of the semiconductor device. Therefore, the increase of the junction capacitance can be restrained while preventing the disadvantages such as the punch-through accompanying the scale reduction of semiconductor devices. Here, if the whole of the side surface of the aforesaid source/drain regions is an extended part of the extensions, the pocket injection regions need not form a junction with the source/drain regions. Also, if the pocket injection regions form a junction with the source/drain regions, the junction is formed to be limited to the side surface of the source/drain regions under the aforesaid extension regions and to the bottom surface part of the source/drain regions near the corner on the lower side. Here, the terms "lower side" and "lower" refer to the side opposite to the gate electrode as viewed from the channel region, and the terms "upper side" and "upper" refer to the side towards the gate electrode as viewed from the channel region.

In the semiconductor device of the present invention, the junction between the source and drain regions and the pocket injection regions is located successively to the junction between the source extension and drain extension regions and the pocket injection regions.

The extensions are formed at the same height level as the channel region, and the pocket injection regions are formed to cover, from the lower side, the bottom surface of the extension regions. Therefore, the pocket injection regions cover from the side surface to the bottom surface of the extension regions and form a junction at that part, and further successively cover the remaining side surface part of the source/drain regions to form a junction.

In the semiconductor device of the present invention, the junction between the extension regions and the pocket injection regions is located under the side wall spacers.

The pocket injection regions can be formed by injecting an impurity with a good precision and in a self-aligned manner into the region under the part where the side wall spacers are removed, using as a mask the gate electrode and the part which forms the upper region of the source/drain regions and which is resistant against the movement of the impurity. As a result of this, the extension of the depletion layer can be prevented and further the increase of the junction capacitance can be restrained by forming the pocket regions having an increased impurity concentration to be limited to the needed part.

The semiconductor device of the present invention further includes semiconductor compound layers disposed on the source and drain regions and respectively at positions elevated above the channel region.

By disposing a semiconductor layer or a semiconductor compound layer, which is resistant against the injection or thermal diffusion of the impurity, on the upper part of the source/drain regions as described above, the pocket injection regions are prevented from being formed at a deep position beyond the source/drain regions. Therefore, the junction formed between the pocket injection regions and the source/drain regions is not formed on the bottom surface of the source/drain regions, but is formed only on the side surface part thereof, so that the area of the junction will be extremely small as compared with the conventional case. Furthermore, an impurity of the conductivity type opposite to the source/drain regions is introduced into the lower region of the source/drain regions in forming the aforesaid pocket injection regions, and this impurity cancels the impurity concentration of first conductivity type. For this reason, the impurity concentration of the lower region of the source/drain regions will be low. Therefore, not only the decrease of the area of the junction but also the decrease of the impurity concentration contribute to the reduction of the junction leakage current and the junction capacitance.

In the semiconductor device of the present invention, the semiconductor compound layers disposed at the elevated positions are made of metal silicide.

By disposing an elevated silicon or silicon compound layer which is resistant against the injection or thermal diffusion of the aforesaid impurity, an impurity of second conductivity type can be injected, using that part and the gate electrode as a mask, into a lower region therebetween. For this reason, the pocket injection regions can be formed with a good precision and in a self-aligned manner. Further, even if the source/drain regions are formed at a shallow position in order to prevent the punch-through or the short channel effect, it does not raise a problem, as shown below. Namely, the injected impurity region which is formed in injecting an impurity into the pocket injection regions and which is successive to the pocket injection regions, will not be formed at a deep position beyond the source/drain regions. Therefore, the junction formed between the pocket injection regions and the source/drain regions is not formed on the bottom surface of the source/drain regions, but is formed only on the side surface part thereof, so that the area of the junction will be extremely small as compared with the conventional case. Further, the injected impurity region successive to the aforesaid pocket injection regions allows an impurity of conductivity type opposite to the source/drain regions to be distributed in the source/drain regions. This impurity having the opposite conductivity type cancels the impurity in the lower part of the source/drain regions, so that the impurity concentration of this part of the source/drain regions will be low. Therefore, not only the decrease of the area of the junction but also the decrease of the impurity concentration contribute to the reduction of the junction capacitance or the junction leakage current.

The semiconductor device of the present invention further includes metal films deposited on the source and drain regions and respectively at positions elevated above the channel region.

The aforesaid metal films will be resistant against the injection or thermal diffusion of the impurity in the same manner as the aforesaid elevated semiconductor layer or semiconductor oxide film, whereby the pocket injection regions are prevented from being formed on the bottom surface side of the source/drain regions. Therefore, the short channel effect and others are prevented while restraining the increase of the parasitic capacitance, and the resistance of the source/drain electrode can be reduced without forming a metal silicide layer on the source/drain electrode.

In the semiconductor device of the present invention, an impurity element heavier than an element constituting the semiconductor is injected into upper regions of the source and drain regions.

The region where the aforesaid heavy impurity has been introduced acts as being resistant to the ion injection or thermal diffusion of the impurity. This prevents the pocket injection regions from being formed on the bottom surface side of the source/drain regions and also cancels and lowers the impurity concentration in a lower layer region of the source/drain regions without physically providing an elevated structure. Therefore, the junction capacitance, the junction leakage current, and others can be prevented while restraining the punch-through and the short channel effect with the use of a compact structure. The aforesaid heavy impurity is preferably an impurity of first conductivity type.

A method of producing a semiconductor device of the present invention includes the steps of forming a gate electrode on a channel region formed from a surface of a semiconductor layer to a predetermined depth, and forming a pair of side wall spacers on both sides of the gate electrode. Further, the production method includes the steps of forming semiconductor layers, each being elevated above the channel region, on regions which is outside the pair of side wall spacers and in which source and drain regions of first conductivity type are to be formed, and removing the pair of side wall spacers. Further, the production method includes the step of forming a pair of pocket injection regions of second conductivity type by introducing, after the side wall spacers are removed, an impurity of second conductivity type below a region where the side wall spacers were formed, the pair of pocket injection regions respectively covering only a neighborhood of respective side surface parts, on the channel region side, of the region where the source and drain regions are to be formed, so as to form a junction only between the neighborhood of the side surface parts and the pocket injection region.

By the aforesaid construction, the pocket injection regions can be formed with a good precision in the lower region between the gate electrode and the elevated semiconductor layers by means of an ion injection method, a method using solid phase diffusion from BSG or PSG containing an impurity, or the like method. Since the elevated semiconductor layers are resistant against the injection or diffusion of the impurity, the impurity does not penetrate deep beyond the region where the source/drain regions are to be formed. For this reason, the injected impurity region successive to the pocket injection regions is not formed on the bottom surface side of the source/drain regions. Therefore, a junction is not formed on the bottom surface of the source/drain regions, and the junction is limited to the side part of the source/drain regions. Also, the injected impurity region which is distributed in the source/drain regions and which is successive to the pocket injection regions cancels the impurity-concentration of the source/drain regions, and lowers the concentration thereof. As a result of this, the junction capacitance and the junction leakage current can be restrained while restraining the punch-through and the short channel effect accompanying the scale reduction. Here, "the region where the source/drain regions are to be formed" refers to the source/drain regions before the impurity is introduced; however, it may be simply referred to as "source/drain regions" if confusion does not occur.

In the method of producing a semiconductor device of the present invention, an impurity of second conductivity type is injected into a region below the region where the side wall spacers were formed, using the gate electrode and the elevated semiconductor layers as a mask in forming the pocket injection regions.

If the ion injection method or the like is used in the aforesaid production method, the pocket injection regions can be formed in a self-aligned manner in a predetermined region using, as a mask, the gate electrode and the part which is resistant against the movement of the impurity. Therefore, the pocket injection regions can be formed with certainty in the region where it is necessary to prevent the depletion layer from being extended to the channel region side. As a result of this, the junction is not formed in an unnecessarily large amount, whereby the increase of the junction capacitance can be prevented while preventing the punch-through and others.

The method of producing a semiconductor device of the present invention further includes a step of respectively forming source extension and drain extension regions of first conductivity type that extend from the region where the source and drain regions are to be formed, by introducing an impurity of first conductivity type into a region which is in contact with a surface of the pocket injection regions on a side of the region where the source and drain regions are to be formed, successively after the pocket injection regions are formed.

By the aforesaid production method, the pocket injection regions and the source extension and drain extension regions can be formed in the same step, thereby preventing the large increase of the number of steps. Needless to say, in the above method, the ion injection method of bombarding with ions or the method of using solid phase diffusion from BSG or PSG containing an impurity, and other methods are to be used.

The method of producing a semiconductor device of the present invention further includes, after the step of respectively forming the source extension and drain extension regions, a step of forming side wall spacers again in the region where the side wall spacers were formed, thereafter a step of introducing an impurity of first conductivity type into the region where the source and drain regions are to be formed, so as to form the source and drain regions, and a step of turning the elevated semiconductor layers into metal silicide.

By the above construction, the source/drain regions can be formed using the reproduced side wall spacers as a mask. Typically, a heating treatment for activating the impurity is carried out in forming the source/drain regions. At this time, the impurity of first conductivity type is injected so that the region successive to the pocket injection regions that have been previously formed to be elevated will all be the source/drain regions of first conductivity type. As a result of this, the increase of the junction capacitance can be restrained while restraining the short channel effect accompanying the scale reduction of the semiconductor devices.

The method of producing a semiconductor device of the present invention further includes, between the step of forming the elevated semiconductor layers and the step of removing the side wall spacers, a step of introducing an impurity of first conductivity type through the elevated semiconductor layers into a lower region to form the source and drain regions.

In the above production method, the step of forming the pocket injection regions and the source extension and drain extension regions is carried out after the source/drain regions are formed. As described above, for forming the source/drain regions, a heating treatment for activating the impurity is carried out after the introduction of the impurity. As a result of this, the heat history received by the impurity of the pocket injection regions and the source extension and drain extension regions can be reduced, and a sharp rise and fall of the impurity profile can be formed in the aforementioned region. As a result of this, the extension of the depletion layer can be effectively prevented to restrain the punch-through and the short channel effect. Also, since the junction is not formed at unnecessary locations, the parasitic junction capacitance can be restrained.

The method of producing a semiconductor device of the present invention further includes, after the steps of forming the source and drain regions, removing the side wall spacers, and respectively forming the pocket injection regions and the source extension and drain extension regions, a step of forming side wall spacers again in a region where the side wall spacers were formed and a step of turning an upper part of the elevated semiconductor layers into metal silicide.

By the above construction, since the heating treatment after the introduction of the impurity into the source/drain regions is usually carried out already before the pocket region injection, the heat history to the impurity in the pocket injection regions and the source extension and drain extension regions can be reduced. As a result of this, a sharp profile of the impurity concentration in these regions can be formed.

The method of producing a semiconductor device of the present invention further includes, after the step of forming the source and drain regions and before the step of removing the side wall spacers, a step of turning the elevated semiconductor layers into metal silicide.

By the above construction, since the heating treatment after the introduction of the impurity into the source/drain regions is usually carried out already before the pocket region injection, the heat history to the impurity in the pocket injection regions and the source extension and drain extension regions can be reduced. As a result of this, a sharp profile of the impurity concentration in these regions can be formed. Also, since the process can be carried out without forming an outer layer of the side wall spacers, the number of steps for forming the second side wall spacers can be reduced.

In the method of producing a semiconductor device of the present invention, the step of forming the side wall spacers preferably includes a step of forming the side wall spacers so as to form a two-layer structure having a lower layer of silicon oxide film and an upper layer of silicon nitride film. Also, the step of removing the side wall spacers preferably includes a step of removing the outer layer of silicon nitride film and leaving the inner layer of silicon oxide film.

Since the materials constituting the above-mentioned two-layer structure can be etched with good selectivity to each other, the outer layer can be removed with good precision, for example, for forming the pocket injection regions. Therefore, the gate electrode and others are not exposed to an atmosphere during the production, so that the aforesaid semiconductor device can be produced to have a high reliability.

Also, if it is preferable to form the pocket injection regions and others by ion injection with a low energy, the step of removing the side wall spacers includes a step of removing both the outer layer of silicon nitride film and the inner layer of silicon oxide film.

Since the silicon oxide film on the surface of the semiconductor layers above the pocket injection regions or the extension regions is removed, the ion injection can be carried out with a low energy. Therefore, the pocket injection regions and the extension regions having a sharp impurity concentration distribution can be formed. Here, it goes without saying that the above-mentioned side wall spacers refer not only to the side wall spacers formed first but also the second side wall spacers formed again.

In the method of producing a semiconductor device of the present invention, in the step of forming the pocket injection regions, an impurity of second conductivity type is introduced by ion injection method, and its injection angle $\theta$ from the vertical direction is set to be not larger than $\tan^{-1}(Ls/Te)$. Here, Ls=width of the removed side walls, and Te=height by which the source and drain regions are elevated from the channel region.

By the above-mentioned production method using the ion injection method, the pocket injection regions can be formed to be extended towards a desired direction from the region of the part where the aforesaid side wall spacers have been removed. As a result of this, the injection angle $\theta$ can be changed and optimized in accordance with the change of design or the variation at the time of production.

In the method of producing a semiconductor device of the present invention, it is preferable that a facet surface is formed at an upper part of the elevated semiconductor film on the gate side, and the facet surface is disposed so that the distance between the gate and the facet surface increases in an upward direction.

By this construction, the ion injection angle can be increased even with the same elevated height Te and with the same width Ls of the removed side walls. Therefore, the pocket injection regions can be easily formed at an intended position. Thus, the junctions of the pocket injection regions with the extension regions and the source/drain regions can be accurately limited.

In the method of producing a semiconductor device of the present invention, after the side wall spacers are removed, a deposition layer containing an impurity of second conductivity type is formed and then a heat treatment is carried out so that the impurity of second conductivity type is introduced by thermal diffusion from the deposition layer containing the impurity of second conductivity type, thereby to form the pocket injection regions.

By forming the pocket injection regions by thermal diffusion from the aforesaid dielectric film, the impurity distribution of the regions can be made to have a sharp profile.

In the method of producing a semiconductor device of the present invention, instead of the step of forming the semiconductor layers to be elevated above the channel region, either one of an oxide film or a nitride film of the semiconductor is formed to be elevated above the channel region by either one of a thermal oxidation method and a thermal nitriding method.

The aforesaid semiconductor-oxide film or nitride film will be resistant in the ion injection or thermal diffusion of the impurity. Therefore, in forming the pocket injection regions, the part successive to the pocket injection regions does not go beyond the source/drain regions to be formed on the bottom surface side thereof. For this reason, the pocket injection regions form a junction only with the neighborhood of the side surface part of the source/drain regions on the channel region side. As a result of this, the increase of the junction capacitance can be restrained while preventing the short channel effect. With respect to the aforesaid oxide film and nitride film, the aforesaid elevated oxide layer or the elevated nitride layer can be formed using an apparatus that has been heretofore put to use, so that the rise in the production costs can be restrained.

In the method of producing a semiconductor device of the present invention, instead of the step of forming the semiconductor layers to be elevated above the channel region, a metal layer is formed to be elevated above the channel region.

The aforesaid metal film performs the same function as the aforesaid elevated semiconductor layer, semiconductor oxide film, or semiconductor nitride film. In other words, the aforesaid metal film will be resistant in the ion injection or thermal diffusion of the impurity. Therefore, the pocket injection regions are prevented from going beyond the source/drain regions to be formed on the bottom surface side thereof. Therefore, the short channel effect and others can be prevented while restraining the increase of the parasitic resistance, and the junction of the source/drain regions can be reduced to restrain the increase of the junction capacitance. Further, by using the aforesaid metal film, the resistance of the source/drain electrode can be reduced without forming a metal silicide layer on the source/drain electrode.

In the method of producing a semiconductor device of the present invention, instead of the step of forming the semiconductor layers to be elevated above the channel region, an impurity element heavier than an element constituting the semiconductor is introduced into an upper part of the source and drain regions.

The region where the aforesaid heavy impurity has been introduced will be resistant in the ion injection or thermal diffusion of the impurity, like the aforesaid elevated semiconductor layer, semiconductor oxide film, semiconductor nitride film, or metal film. Therefore, the pocket injection regions are prevented from going beyond the source/drain regions to be formed on the bottom surface side thereof. Therefore, the short channel effect and others can be prevented while restraining the increase of the parasitic resistance, and the junction of the source/drain regions can be reduced to restrain the increase of the junction capacitance. Also, the region which will be resistant to the movement of the impurity can be formed without physically providing an elevated structure. Therefore, the increase of the junction capacitance can be prevented while producing a MOSFET structure having an ordinary structure with the use of an ordinary MOSFET producing apparatus, and while preventing the punch-through and the short channel effect accompanying the scale reduction. Here, the aforesaid heavy impurity element is preferably an impurity of first conductivity type.

The foregoing and other objects, features, aspects, and advantages of the present invention will become more apparent from the following detailed description of the present invention when taken in conjunction with the accompanying drawings.

DESCRIPTION OF THE PREFERRED EMBODIMENTS

Hereafter, the preferred embodiments of the present invention will be described with reference to the attached drawings.

First Embodiment

Figure 1:
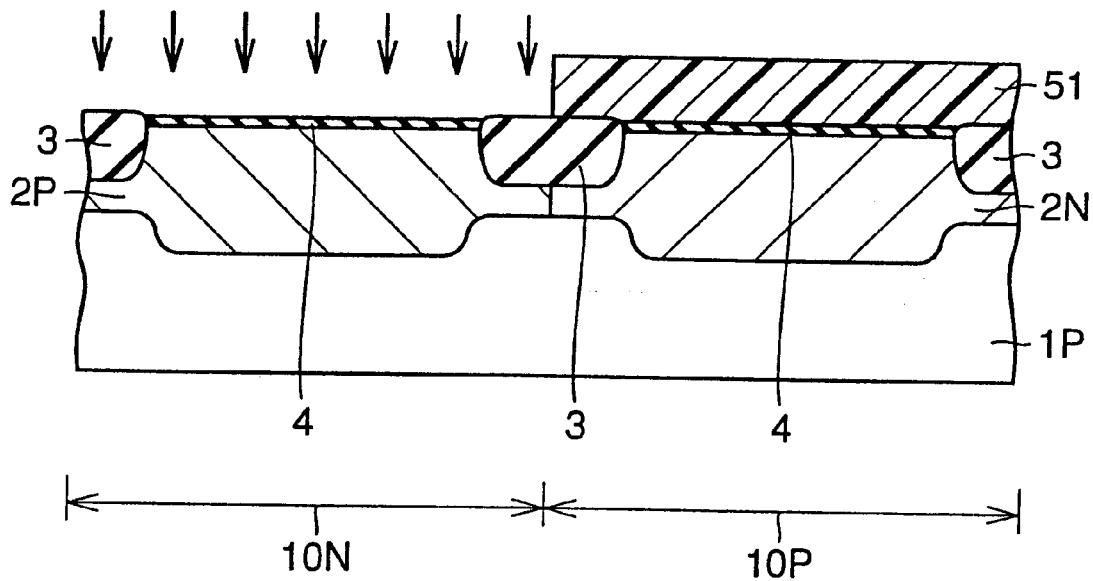
FIG. 1 is a cross section view at a stage in which a p-type impurity is injected into a region which is to become an nMOS, to form a p-well in a method of producing a CMOS in the first embodiment of the present invention.
Figure 2:
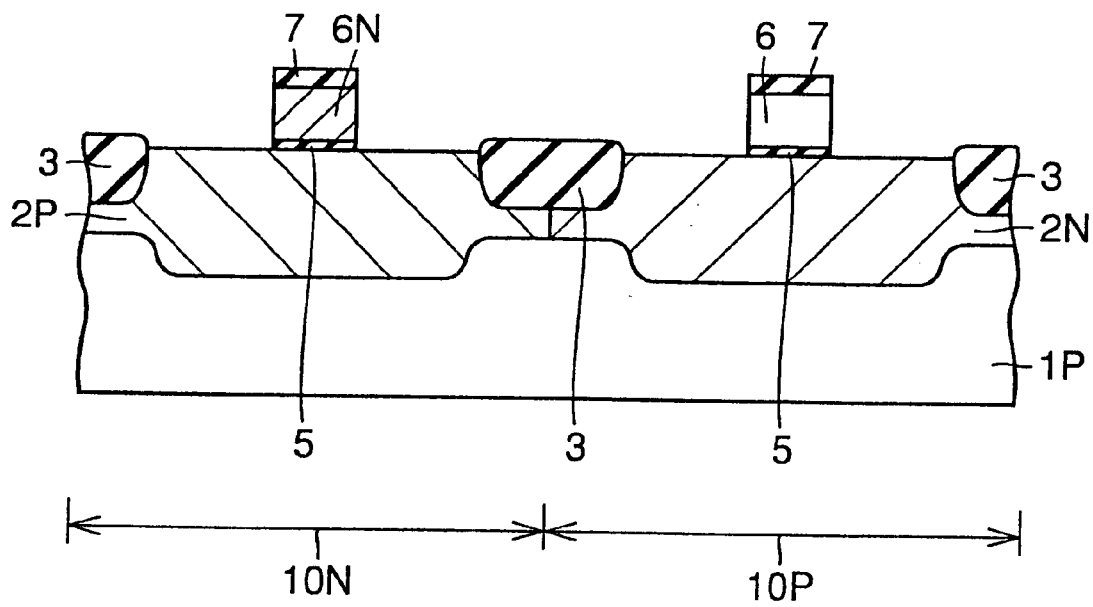
FIG. 2 is a cross section view at a stage in which a gate electrode is patterned after the step shown in FIG. 1.

First, a method of producing a CMOS, which is a semiconductor sit device in the first embodiment, and a structure thereof will be described. First, by a general method, a device isolation region 3 is formed in a p-type silicon substrate 1P of (100) surface. Next, a resist 51 and others are alternately formed in correspondence with nMOS and pMOS regions 10N, 10P. With these used as a mask, a p-well 2P and an n-well 2N are formed by ion injection through a pad oxide film 4 on the silicon substrate surface (FIG. 1). Thereafter, the pad oxide film 4 is removed; a gate oxide film 5 is formed; a non-doped polysilicon 6 is deposited thereon; and ions such as phosphorus or arsenic are injected into the polysilicon of the nMOS region 10N to form an n-type impurity region 6N. Then, a silicon oxide film to become an etching mask is deposited; a gate is patterned by lithography; the silicon oxide film is etched using the gate as a mask; and the polysilicon is etched using the silicon oxide film as a mask to form a gate electrode (FIG. 2).

Figure 3:
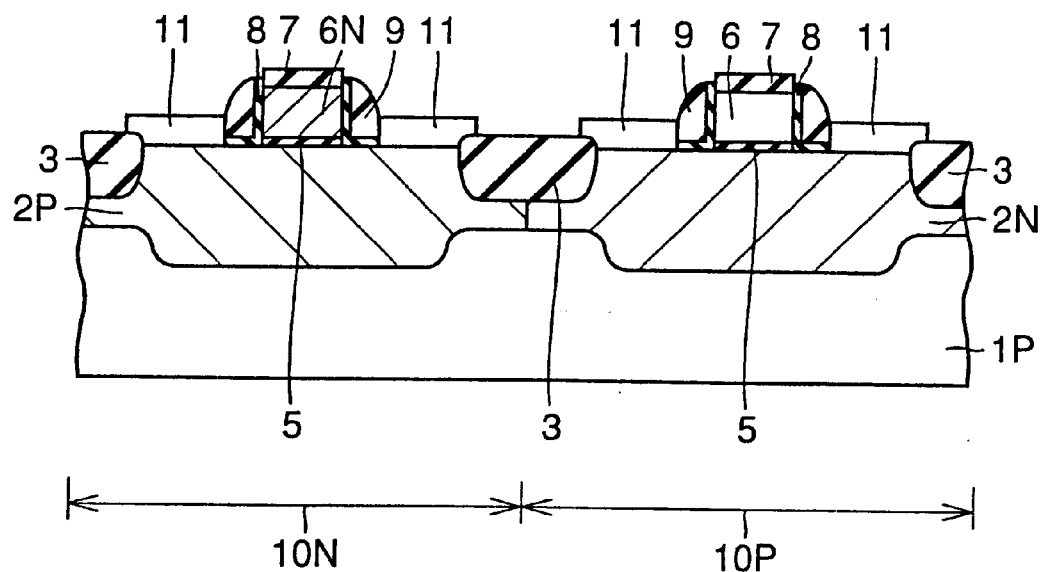
FIG. 3 is a cross section view at a stage in which an epitaxial silicon film, which is to become a part of elevated source/drain regions, is formed after the step shown in FIG. 2.
Figure 4:
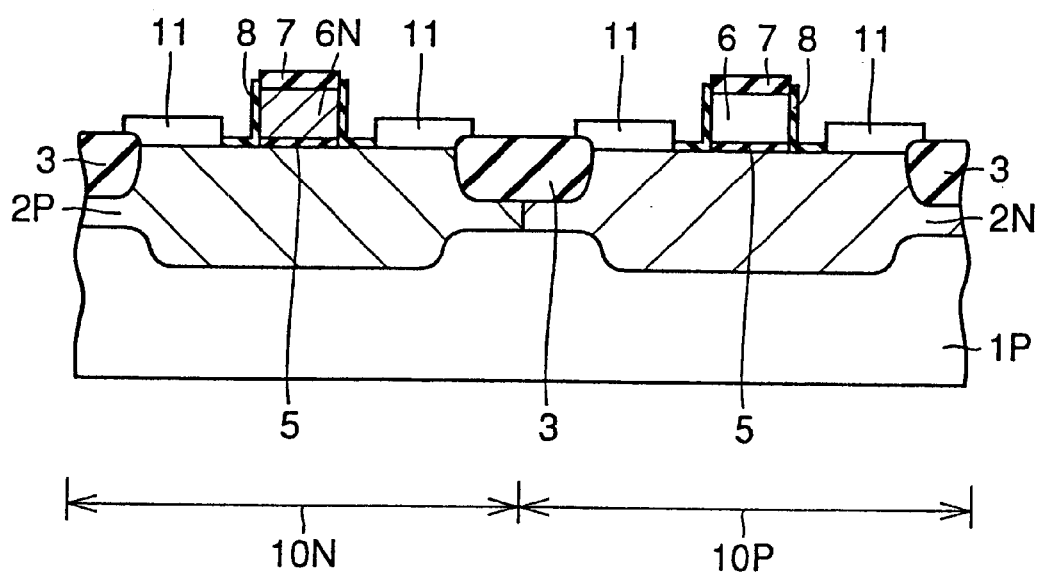
FIG. 4 is a cross section view at a stage in which a silicon nitride film, which is an outside part of a side wall spacer, is removed after the step shown in FIG. 3.

Next, by a general method, a silicon oxide film 8 and a silicon nitride film 9 are deposited, followed by anisotropic etching to form a sidewall spacer 9. Thereafter, an epitaxial silicon film 11 is selectively grown on a region to become source/drain regions on which a silicon surface is exposed, with the use of a reduced-pressure chemical vapor deposition apparatus, an ultra high vacuum chemical vapor deposition apparatus, or the like (FIG. 3). Then, in the side wall spacer part, the side wall spacer 9S of silicon nitride film is removed with phosphoric acid or the like while leaving the silicon oxide film 8 (FIG. 4). Thus, if the silicon oxide film 8 is to be left in the side wall spacer part, the thickness of the silicon oxide film 8 of the side wall spacer part is preferably not larger than 10 nm in view of subsequent impurity injection into extension regions.

Figure 5:
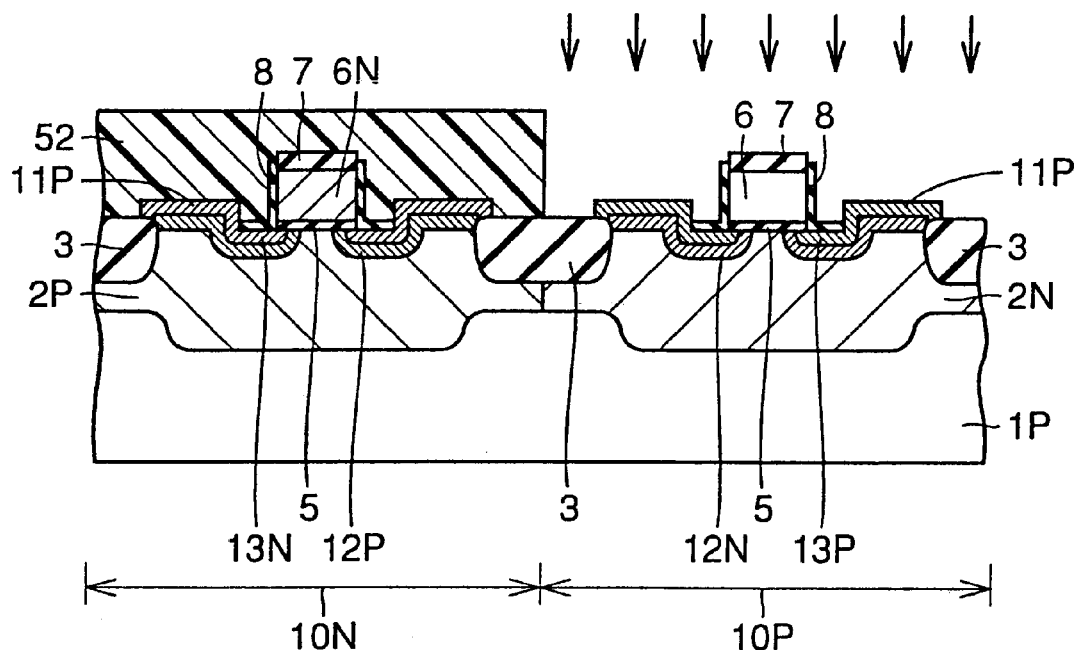
FIG. 5 is a cross section view at a stage in which a pocket injection region and an extension region are formed by injecting an impurity after the side wall spacer is removed.

Next, in the nMOS region 10N, a p-type pocket injection region 12P is formed by ion injection of boron or boron fluoride, and an n-type extension region 13N is formed by ion injection of phosphorus, arsenic, antimony, or the like (See FIG. 5). One of the reasons why the epitaxial silicon film is formed to be elevated as described above is that, in the impurity injection into the aforesaid pocket injection region, the impurity injected region generated below the source/drain regions is shifted upwards by the elevated height. The impurity injected region generated below the source/drain regions will finally be the source/drain regions of the opposite conductivity type. At this time, the impurity concentration of the source/drain regions is canceled to lower the impurity concentration of the source/drain regions. Here, in the figures used for this description, the extension regions are each drawn in exaggeration to be larger extension regions than real ones; however, in reality, the extension regions are far smaller regions as compared with the source/drain regions. In this embodiment, one of the reasons why the junction capacitance is reduced is that the extension regions are extremely small as compared with the source/drain regions.

In the pMOS region 10P, an n-type pocket injection region 12N is likewise formed by ion injection of phosphorus, arsenic, or antimony using a resist 52 as a mask, and a p-type extension region 13P is formed by ion injection of boron, boron fluoride, or the like. In FIG. 5, the p-type impurity is being injected for forming the p-type extension region 13P in the p-MOS region. In forming this p-type extension region, the p-type impurity is injected into an upper layer part of the elevated semiconductor film to form an elevated p-type impurity region 11P. Thereafter, a heat treatment may be carried out for activation after the ion injection.

Figure 6:
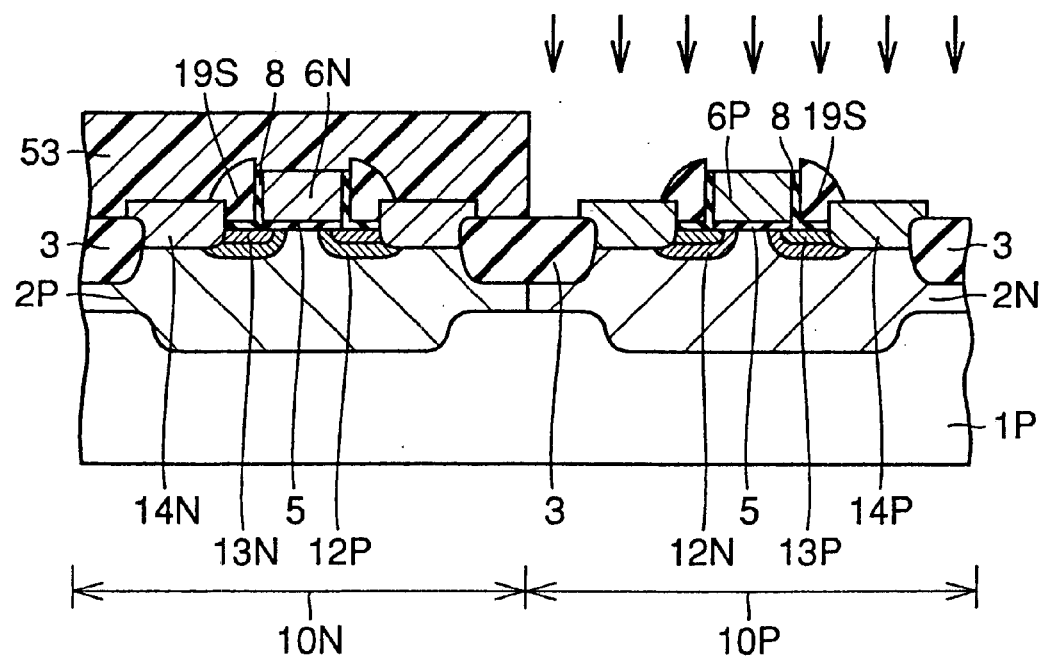
FIG. 6 is a cross section view at a stage in which source/drain regions are formed by injecting an impurity.

Subsequently, a second side wall spacer 19S is formed with a silicon nitride film or the like and, with this second side wall spacer 19S used as a mask, an n-type impurity is injected into the source/drain regions of the nMOS region, and a p-type impurity is injected into the source/drain regions of the pMOS region (FIG. 6). Next, a heating treatment is carried out for activation to form the n-type and p-type source/drain regions 14N, 14P. Here, in forming the second side wall spacer 19S, the silicon oxide film on the gate electrodes 6N, 6P is removed to introduce the p-type impurity also into the polysilicon on the gate oxide film of the region 10P which is to become the pMOS, thereby to form the gate electrode 6P. The width of the second side wall spacer 19S is preferably larger than the width of the first side wall spacer 9S, because then the source/drain regions 14N, 14P will not be locally deep.

Figure 7:
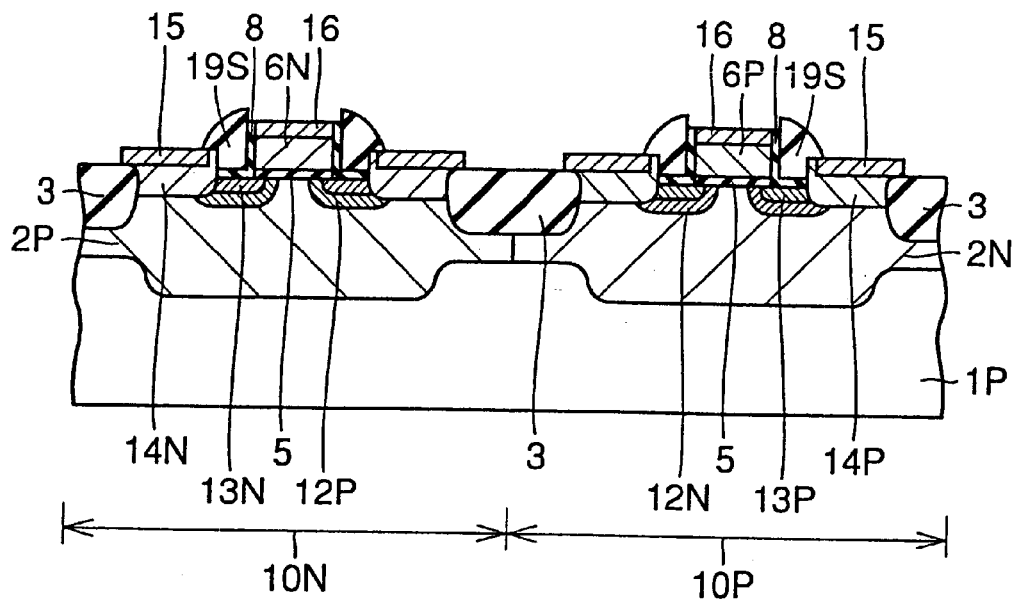
FIG. 7 is a cross section view at a stage in which an upper part of the source/drain regions and a gate region are turned into metal silicide.

Finally, a metal silicide part 15 is formed, as shown in FIG. 7, by an ordinary method on the gate electrode and the source/drain regions where silicon and polysilicon are exposed, followed by forming an interlayer dielectric film, a contact, a wiring, and others to produce a CMOS LSI.

The CMOS in the aforesaid embodiment is produced as described above and the pocket injection region for restraining the punch-through is formed to surround and cover each extension region, so that the punch-through and the short channel effect can be effectively restrained. On the other hand, in forming the pocket injection regions 12N, 12P, the injected impurity region successive to the pocket injection regions is formed at a higher level for the height of the elevated epitaxial silicon film in a part where the source/drain regions 14N, 14P overlap as viewed in a plan view. For this reason, even if the source/drain regions are formed to be sufficiently shallow so as not to generate the punch-through or the short channel effect, the aforesaid injected impurity region can be distributed in the source/drain regions. Since the aforesaid injected impurity region and the source/drain regions have conductivity types different from each other, the aforesaid injected impurity cancels the impurity of the source/drain regions to lower the impurity concentration under the source/drain regions to a great extent. As a result of this, even if the impurity concentration of the pocket injection region is increased to reduce the gate length, the junction leakage current can be restrained to a great extent. Further, since the area of the junction of the pocket injection region with the extension region and the source/drain regions is restrained to a great extent as compared with the conventional case, the increase of the junction capacitance can be restrained. Therefore, a semiconductor device with restrained junction capacitance and junction leakage current can be provided while reducing the scale and preventing the punch-through and the short chanel effect.

Second Embodiment

Next, the second embodiment of the present invention will be described. In the second embodiment, one makes use of a production method different from the method of producing a CMOS in the first embodiment. First, like the method of producing a CMOS in the first embodiment, an epitaxial silicon film 11 is selectively grown on the source/drain regions on which a silicon surface is exposed, with the use of a reduced-pressure chemical vapor deposition apparatus, an ultra high vacuum chemical vapor deposition apparatus (UHV-CVD), or the like. as shown by FIG. 3 in the aforesaid first embodiment. Next, referring to FIG. 8, ion injection is carried out into each of the nMOS and pMOS regions, followed by a heating treatment for activation thereby to form n-type and p-type source/drain regions 14N, 14P. Here, like the first embodiment, the silicon oxide film on the gate electrode is removed, and the p-type impurity is introduced also into the polysilicon on the gate oxide film 5 of the pMOS region 10P to form a gate electrode 6P.

Figure 9:
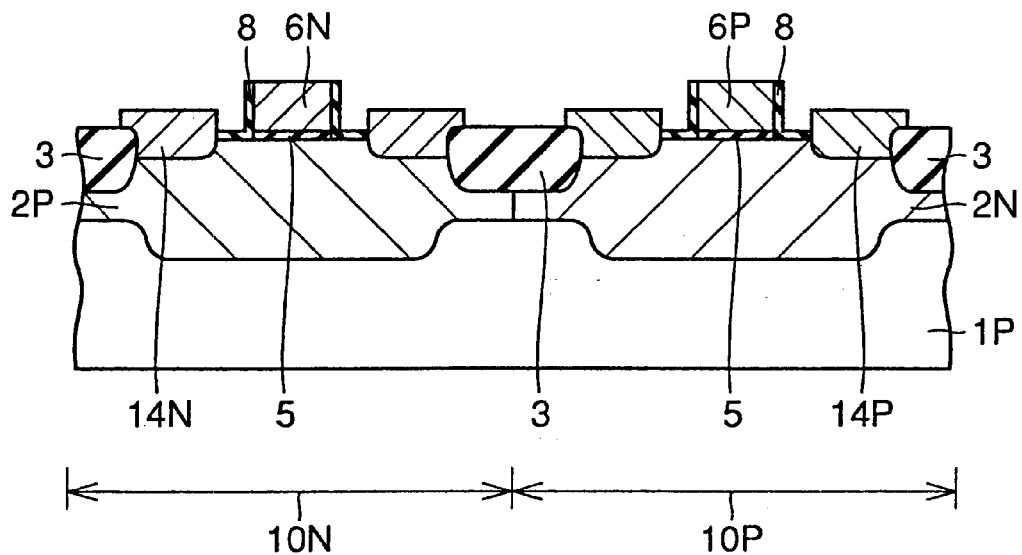
FIG. 9 is a cross section view at a stage in which the side wall spacer is removed after the step shown in FIG. 8.
Figure 10:
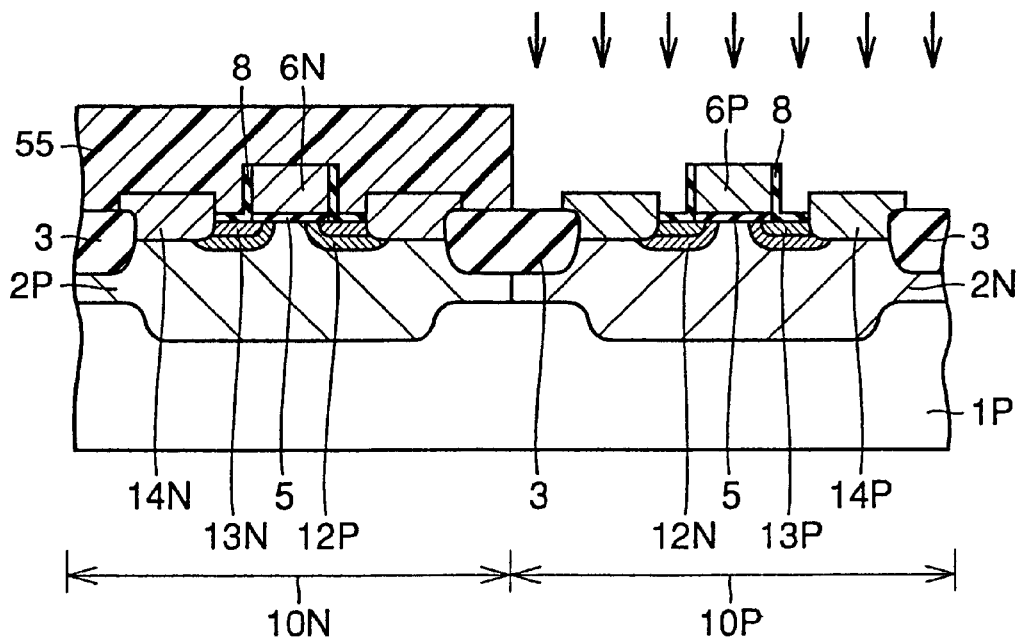
FIG. 10 is a cross section view at a stage in which an n-type pocket injection region and a p-type extension region are formed by injecting an impurity after the step shown in FIG. 9.

Thereafter, the side wall spacer 9S of silicon nitride film is removed with phosphoric acid or the like (FIG. 9), and ion injection of boron or boron fluoride is carried out into the nMOS region 10N to form a p-type pocket injection region 12P. Then, an n-type extension region 13N is formed on the p-type pocket region 12P by ion injection of phosphorus, arsenic, antimony, or the like. Further, ion injection of phosphorus, arsenic, or antimony is carried out into the pMOS region 10P to form an n-type pocket region 12N, followed by ion injection or the like of boron or boron fluoride to form a p-type extension region 13P (FIG. 10). Thereafter, a heating treatment is carried out for activation after the ion injection.

Figure 11:
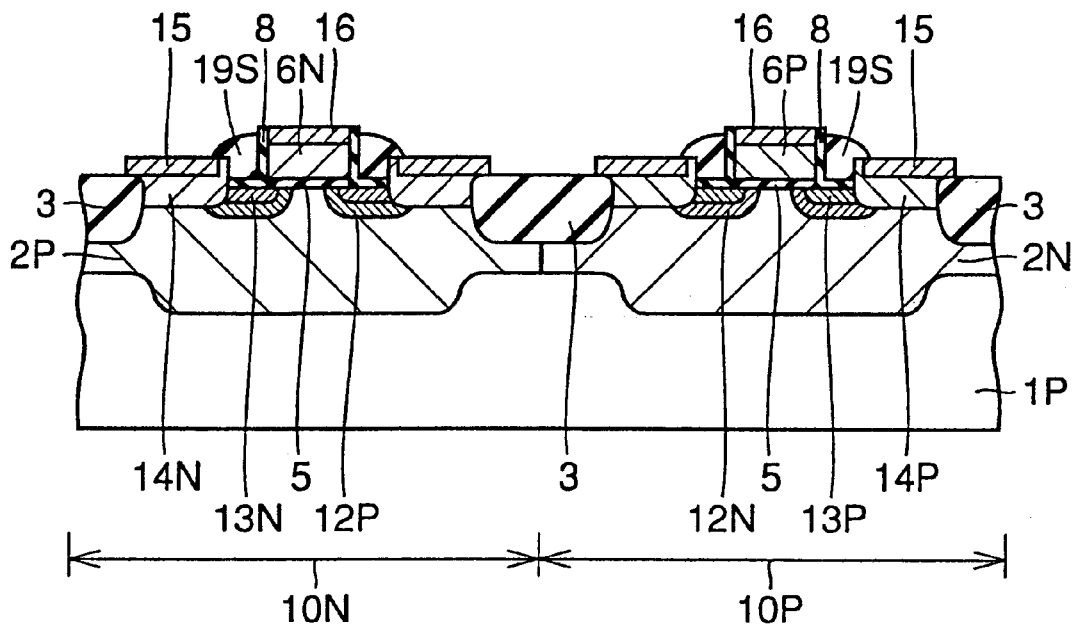
FIG. 11 is a cross section view at a stage in which an upper part of the source/drain regions and a gate region are turned into metal silicide after the step shown in FIG. 10.

Next, the second side wall spacer is formed with the use of silicon nitride film or the like, and metal silicide parts 16, 15 are formed in the upper part of the gate and the source/drain regions where silicon and polysilicon are exposed, by a general production process (FIG. 11). Thereafter, an interlayer dielectric film, a contact, a wiring, and others are formed to produce a CMOS LSI. Here, the width of the second side wall spacer 19S is preferably larger than the width of the first side wall spacer 9S so that the metal silicide region will not be locally deep.

In the above-mentioned production method, the pocket injection regions 12N, 12P and the extension regions 13N, 13P are formed after the heat treatment of activating the impurity of the gate and the source/drain regions. Therefore, the heat treatment to the impurity on the part of the aforesaid pocket injection regions and each of the extension regions can be limited to the required minimum, whereby a sharp profile of the impurity concentration distribution can be obtained. As a result of this, the junction capacitance and the junction leakage current can be prevented with certainty as desired while preventing the punch-through and the short channel effect accompanying the scale reduction of the CMOS.

Third Embodiment

Next, in the third embodiment of the present invention, a method of producing a CMOS different from the method of producing a CMOS in the aforesaid first and second embodiments will be described In the second embodiment, after the source/drain regions are formed by injecting an impurity into the source/drain regions, the pocket injection regions are formed and then the metal silicide forming process is carried out. However, in the third embodiment, the pocket injection regions are formed after the metal silicide forming process of the source/drain regions and the gate electrode.

Figure 8:
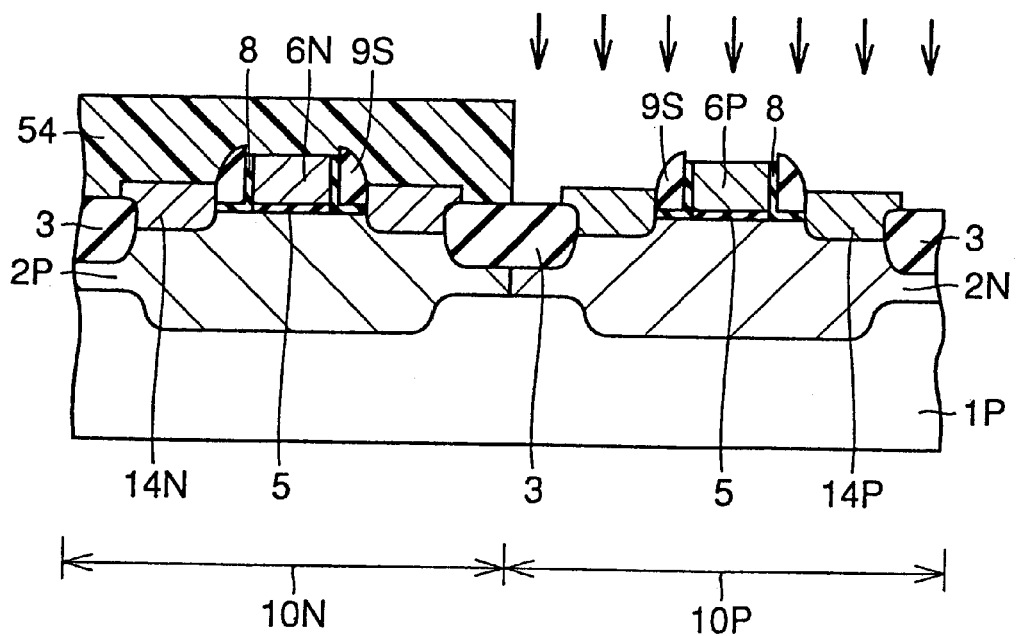
FIG. 8 is a cross section view at a stage in which an impurity is injected into a region which is to become source/drain regions, before the side wall spacer is removed in the second embodiment.
Figure 12:
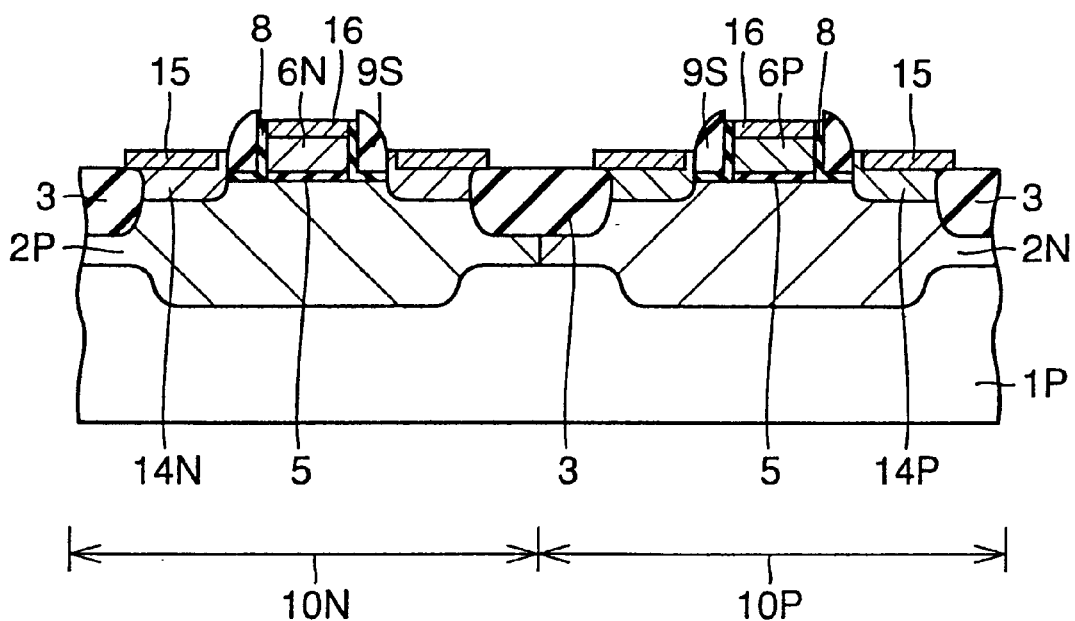
FIG. 12 is a cross section view at a stage in which an upper part of the source/drain regions and a gate region are turned into metal silicide in the third embodiment.

First, as shown in FIG. 8 in the aforesaid second embodiment, ion injection is carried out into each of the nMOS and pMOS regions, followed by a heating treatment for activation to form n-type and p-type source/drain regions. Next, with the use of a general production process, metal silicide parts 15, 16 are formed in: the upper part of the gate electrode and the source/drain regions where silicon and polysilicon are exposed (FIG. 12).

Figure 13:
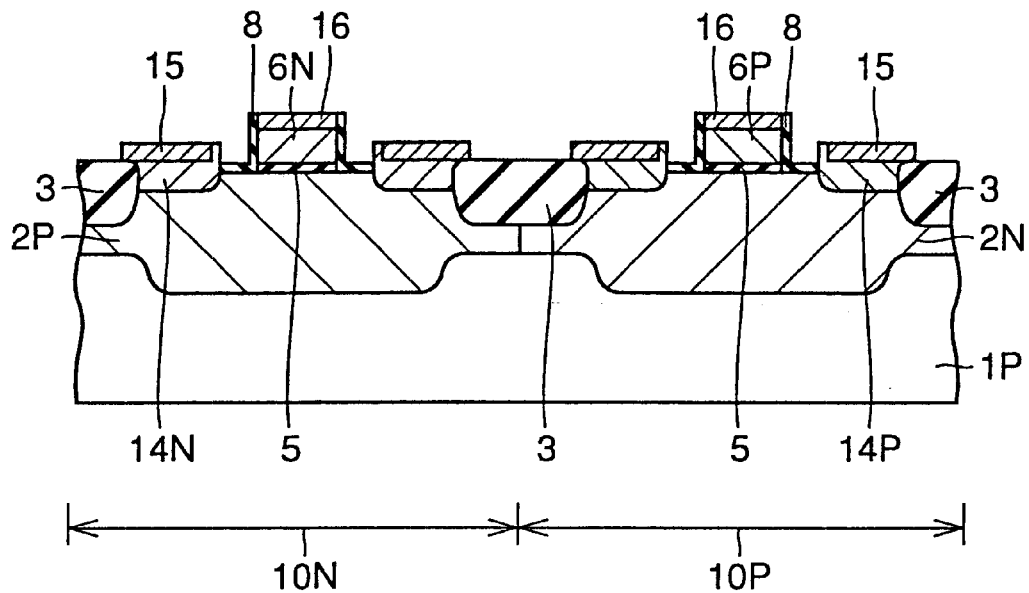
FIG. 13 is a cross section view at a stage in which the side wall spacer is removed after the step shown in FIG. 12.
Figure 14:
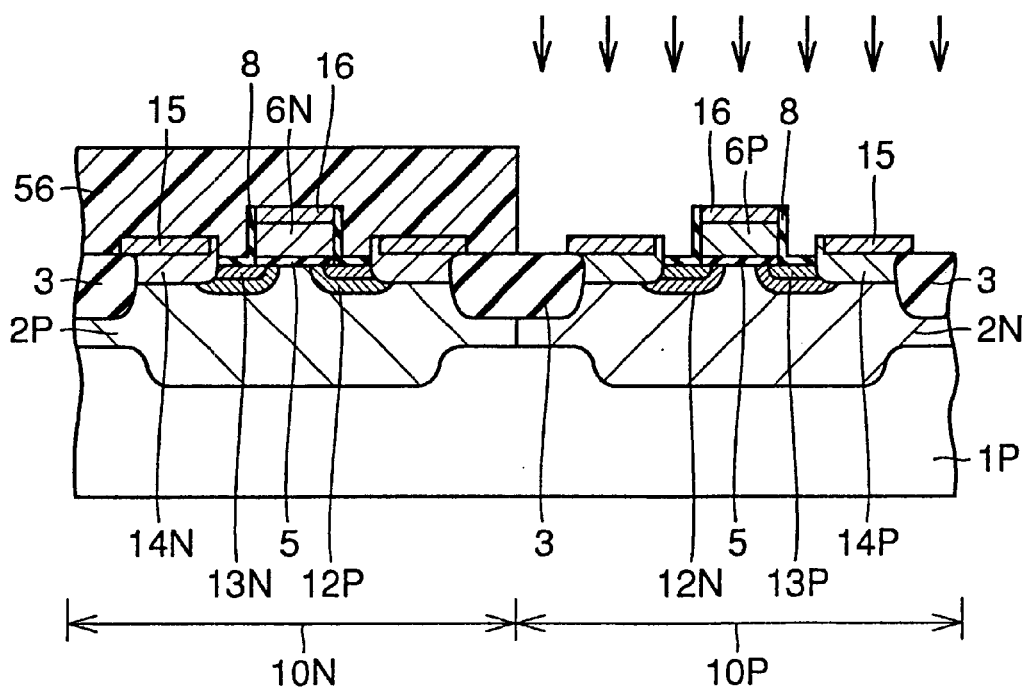
FIG. 14 is a cross section view at a stage in which an n-type pocket injection region and a p-type extension region are formed by injecting an impurity after the step shown in FIG. 13.
Figure 15:
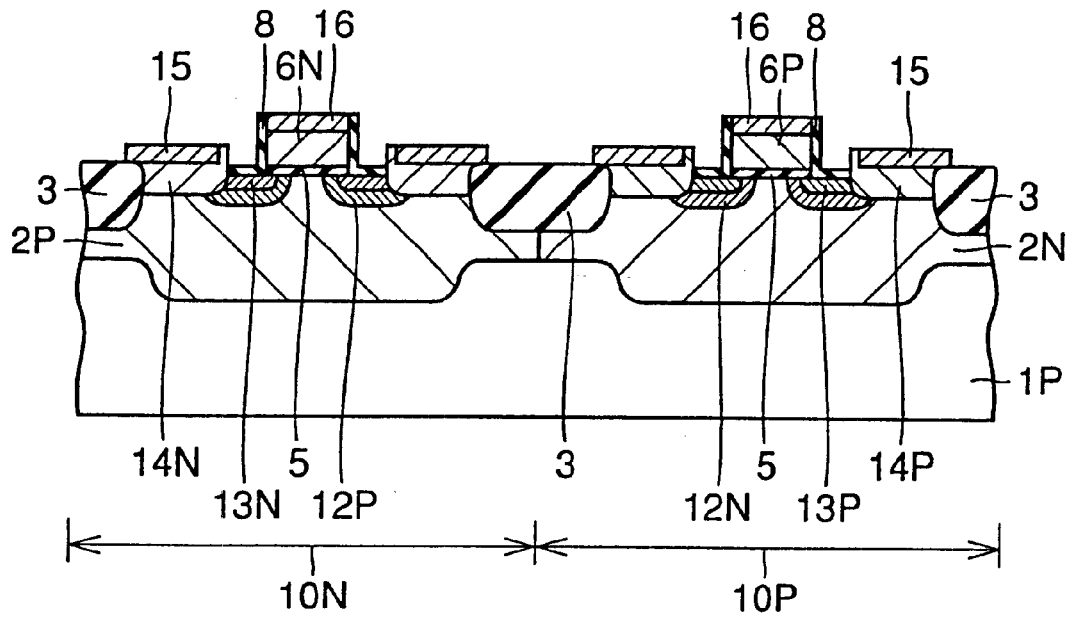
FIG. 15 is a cross section view at a stage in which a heat treatment for activation is carried out after the step shown in FIG. 14.

Thereafter, the side wall spacer 9S of silicon nitride film is removed with phosphoric acid or the like (FIG. 13), followed by ion injection of boron, boron fluoride, or the like into the nMOS region 10N to form a p-type pocket injection region 12P. Next, an n-type extension region 13N is formed thereon by ion injection of phosphorus, arsenic, antimony, or the like. Further, an n-type pocket injection region 12N is formed by ion injection of phosphorus, arsenic, antimony, or the like into the pMOS region 10P, and then a p-type extension region 13P is formed thereon by ion injection of boron, boron fluoride, or the like (FIG. 14). Furthermore, a heat treatment is carried out for activation after the ion injection (FIG. 15). In the third embodiment, the second side wall spacer is not formed. Thereafter, by using a general production process, an interlayer dielectric film, a contact, a wiring, and others are formed to complete a CMOS LSI.

According to the aforesaid production method, like the second embodiment, the pocket injection regions and the extension regions are formed after the heat treatment of activating the impurity of the gate electrode and the source/drain regions. Therefore, a sharp impurity concentration distribution can be obtained in the pocket injection regions and in the extension regions. Furthermore, in this embodiment, the side wall spacer having a silicon nitride film is not used, so that the step of producing the second side wall spacer can be omitted. As a result of this, rise of the production cost can be restrained.

Fourth Embodiment

In the fourth embodiment of the present invention, an example will be described in which a material different from the side wall spacers of the semiconductor devices of the aforesaid first to third embodiments is used as a material for constructing the side wall spacer. In the aforesaid first to third embodiments, a two-layer structure having a silicon oxide film on the inner side and a silicon nitride film on the outer side is used as the material constituting the side wall spacer 9S.

Figure 16:
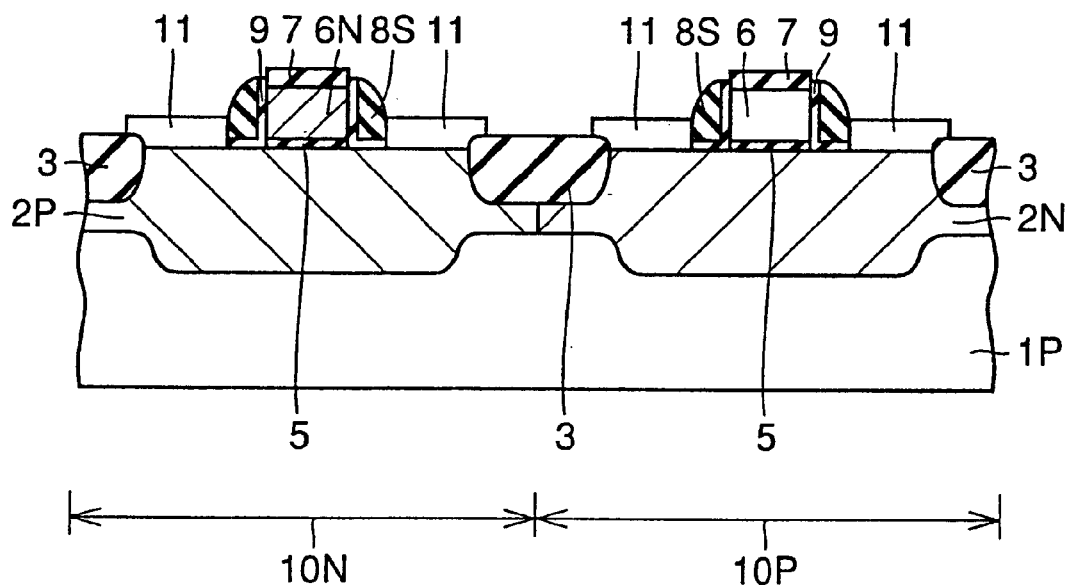
FIG. 16 is a cross section view at a stage in which a side wall spacer made of a two-layer film having a silicon oxide film on the outer side and a silicon nitride film on the inner side, and an epitaxial silicon film, which is to become an upper region of the source/drain regions, is formed in the fourth embodiment.

However, as shown in FIG. 16, a structure may be adopted in which a silicon nitride film is disposed on the inner side and a silicon oxide film is disposed on the outer side. By adopting such a construction, selectivity of silicon oxide film can be ensured more than the selectivity of silicon nitride film in selectively growing an epitaxial silicon film on a region which is to become source/drain regions and on which a silicon surface is exposed. Therefore, the production margin can be increased by disposing the silicon oxide film on the outer side.

Figure 17:
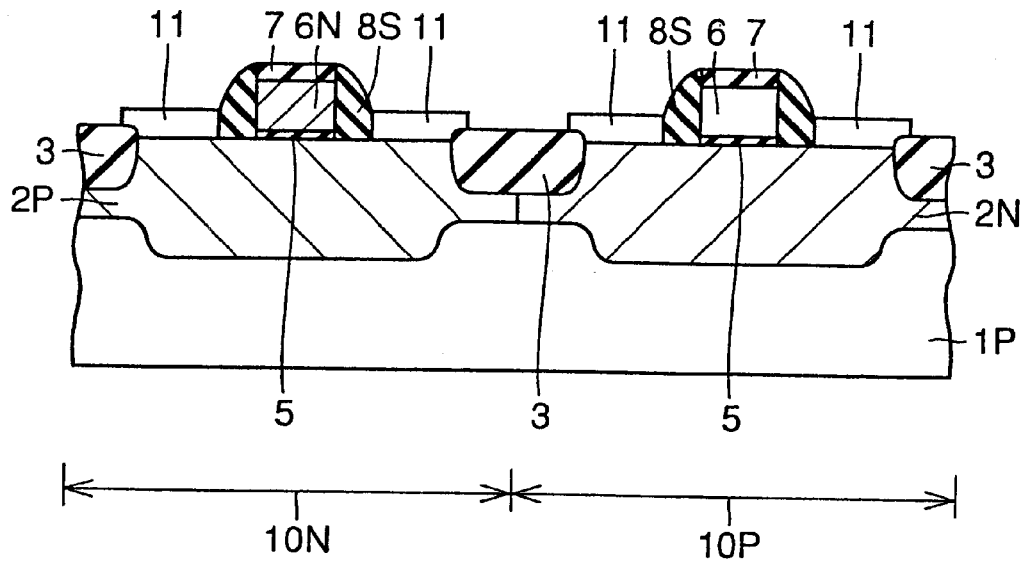
FIG. 17 is a cross section view at a stage in which a side wall spacer made of a single layer of silicon oxide film is formed and an epitaxial silicon film, which is to become an upper region of the source/drain regions, is formed in a modification of the fourth embodiment.

Further, if an emphasis is to be placed on reduction of the number of steps, a side wall spacer made of a single layer of silicon nitride film or silicon oxide film may be formed, as shown in FIG. 17.

Fifth Embodiment

Figure 18:
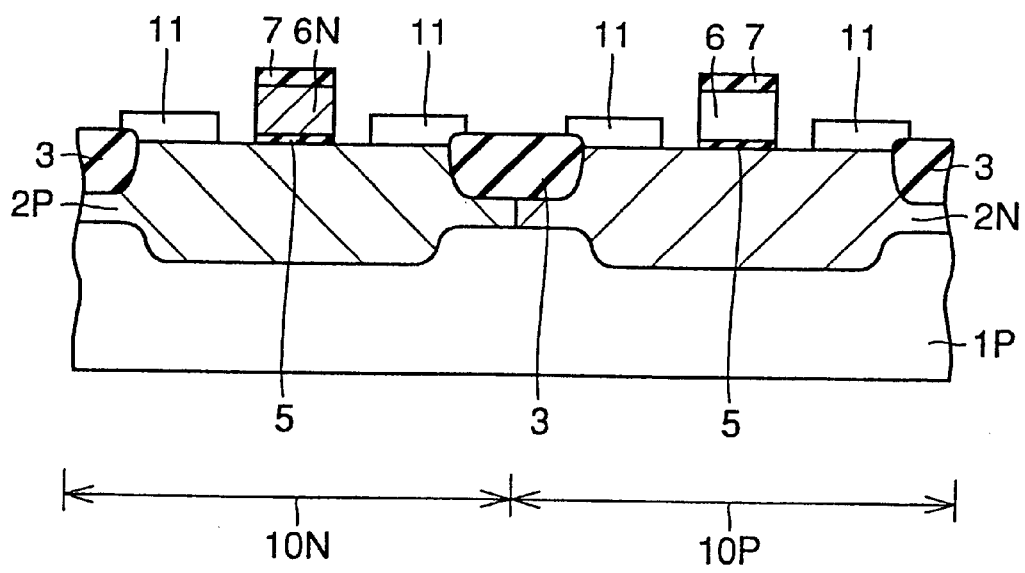
FIG. 18 is a cross section view at a stage in which an impurity is in injected after the silicon oxide film on the silicon substrate surface is removed in the fifth embodiment.

In the fifth embodiment of the present invention, a production method for injecting an impurity for forming a pocket injection region by using a gate electrode as a mask in a state in which a protective film is absent on the side surface of the gate electrode. In the aforesaid first to third embodiments, the pocket injection regions 12N, 12P and the extension regions 13N, 13P are formed while maintaining a state in which the thin silicon oxide film 8 on the inner side or on the silicon substrate is left in removing the side wall spacer. However, as shown in FIG. 18, the pocket injection regions 12N, 12P and the extension regions 13N, 13P may be formed after the silicon oxide film on the inner side is also removed. By using a production method of introducing an impurity after the silicon oxide film on the substrate surface is removed, the impurity can be introduced into the silicon substrate by ion injection of a low energy. Therefore, the extension regions can be formed to have a sharp impurity concentration distribution, thereby effectively restraining the punch-through and the short channel effect.

Sixth Embodiment

Figure 19:
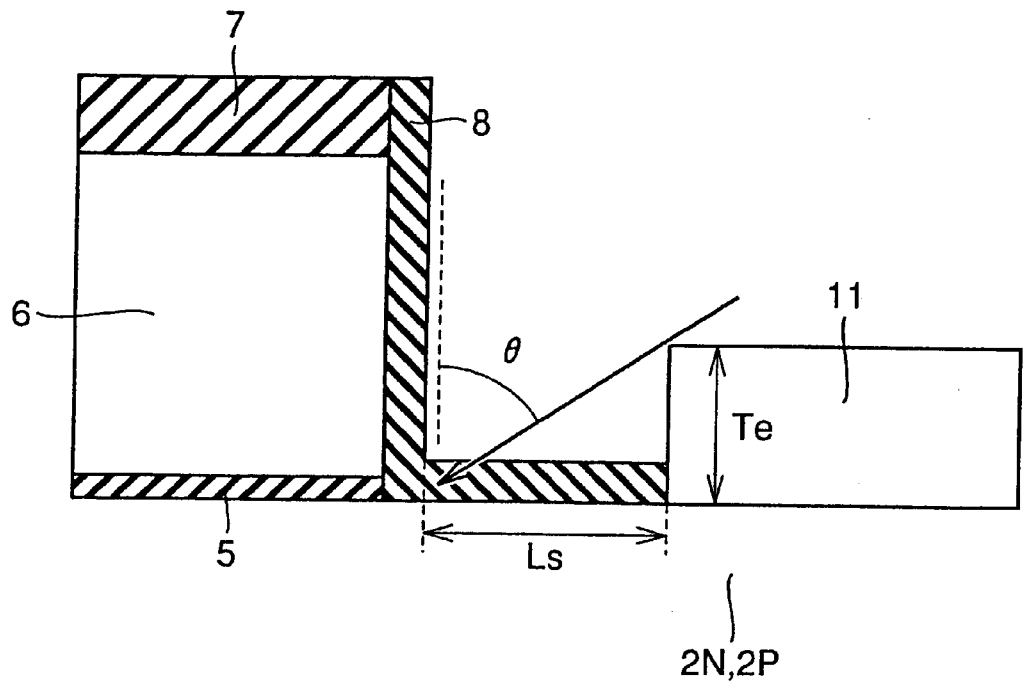
FIG. 19 is a view for explaining the range of ion injection angle in the sixth embodiment.

In the sixth embodiment of the present invention, an impurity injection angle in forming the pocket injection regions will be described. In order to effectively restrain the punch-through and the short channel effect accompanying the scale reduction of the semiconductor devices, the pocket injection regions 12N, 12P must be formed to cover the extension regions 13N, 13P. For this purpose, it is effective to form the pocket injection regions by ion injection in an oblique direction, as shown in FIG. 19. At this time, in order to reduce the shielding effect of the epitaxial silicon film, the range of the angle θ must be $\theta < \tan^{-1}(Ls/Te)$, where Te is the thickness of the epitaxial silicon film and Ls is the thickness (side height) of the removed side wall spacer. If Te=50 nm and Ls=30 nm, θ<45° is a preferable injection angle range, and if Te=40 nm and Ls=30 nm, θ<37° is a preferable injection angle range. By using this injection angle range, the pocket injection regions can be effectively formed to be extended sideways in the downward direction, whereby the surface of the extension regions on the channel region side can be covered.

Figure 20:
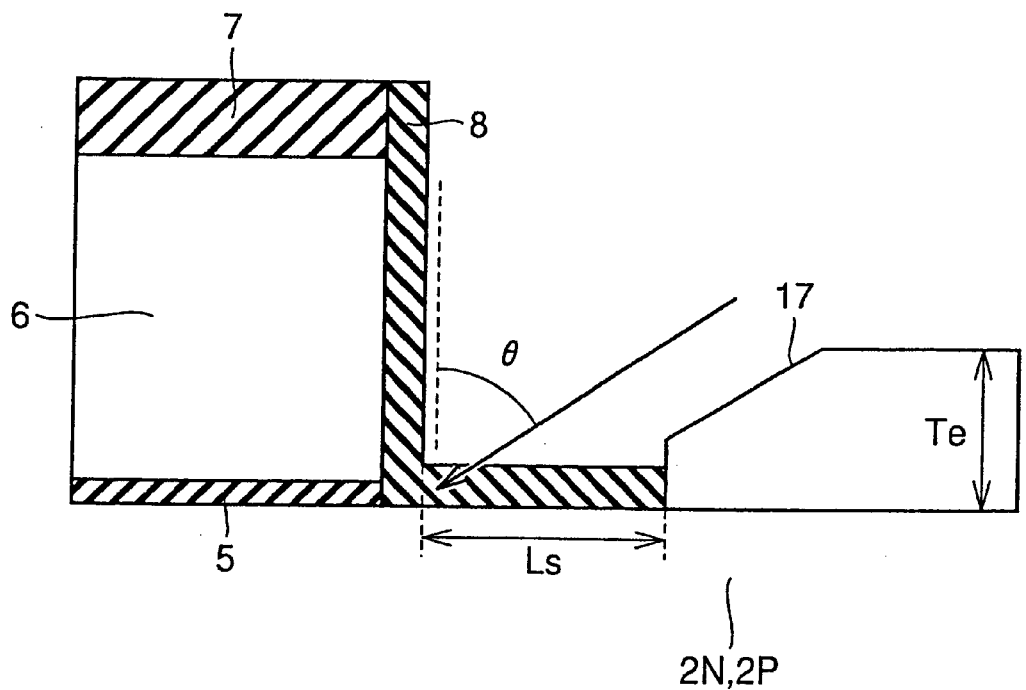
FIG. 20 is a view for explaining the extension of the range of the ion injection angle by forming a facet surface on the epitaxial silicon film.

Further, by suitably controlling the growth condition in growing the epitaxial silicon film, a shape such as shown in FIG. 20 can be made by allowing a facet surface such as (111) or (311) to appear. As a result of this, the shielding effect of the epitaxial silicon film can be reduced even with the same values of Te and Ls, whereby the range of θ can be widened. In other words, the pocket injection regions can be extended sideways more easily to cover the surface of the extension regions on the channel region side with certainty.

Seventh Embodiment

In the seventh embodiment of the present invention, a production method of forming the pocket injection regions by diffusion from a deposited film containing an impurity will be described. In each of the aforesaid first to sixth embodiments, the pocket injection regions are formed by ion injection. In this embodiment, after BSG (boro-silicate glass) containing 1 to 20% of boron is deposited, a heat treatment is carried out to diffuse boron in solid phase from the BSG to form the p-type pocket injection region for nMOS. Further, after PSG (phospho-silicate glass) containing 1 to 20% of phosphorus is deposited, a heat treatment is carried out to diffuse phosphorus in solid phase from the PSG to form the n-type pocket injection region for pMOS.

Figure 21:
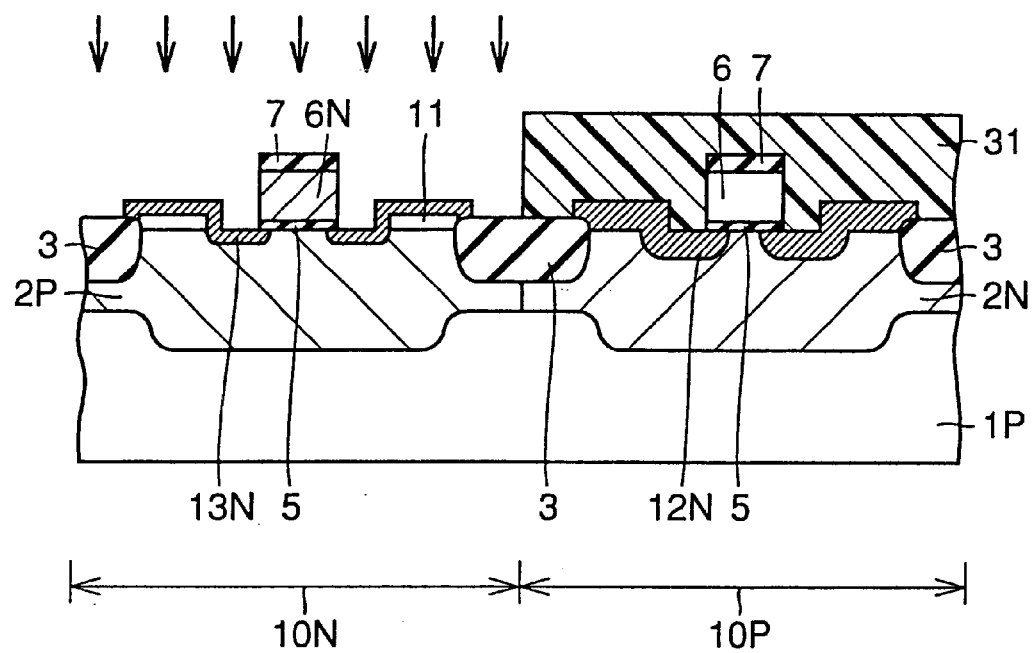
FIG. 21 is a cross section view at a stage in which an n-type extension region and an n-type pocket region for an nMOS are formed by using PSG in the seventh embodiment.
Figure 22:
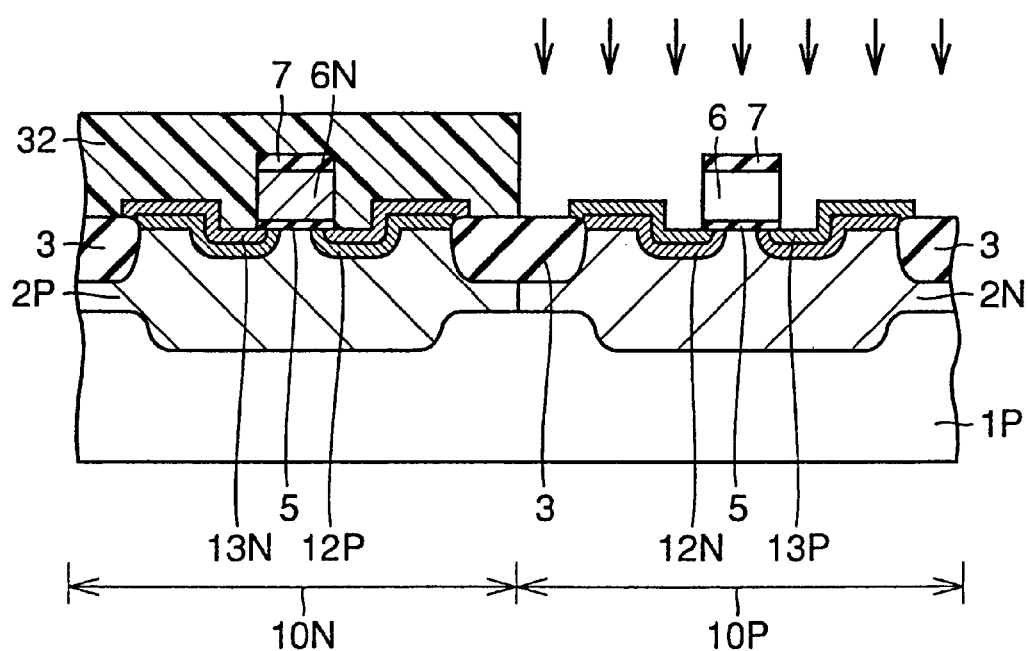
FIG. 22 is a cross section view at a stage in which a p-type extension region and a p-type pocket region for a pMOS are formed by using BSG in the seventh embodiment.

If solid phase diffusion such as described above is to be utilized, there is a fear of increase in the number of steps. However, as shown in FIG. 21, after the PSG is deposited, the PSG in the nMOS region is removed, and ion injection of phosphorus, arsenic, antimony, or the like is carried out into the nMOS region using the PSG 31 of the pMOS region as a mask, followed by a heat treatment. Through this production process, the n-type pocket injection region 12N and the n-type extension region 13N can be effectively formed. Further, as shown in FIG. 22, after the BSG is deposited, the BSG in the pMOS region is removed, and ion injection of boron, boron fluoride, or the like is carried out into the pMOS region using the BSG 32 of the nMOS region as a mask, followed by a heat treatment. Through this production process, the p-type pocket injection region 12P and the p-type extension region 13P can be effectively formed.

By the aforesaid production method, a sharp profile of the impurity concentration of the pocket injection regions and each of the extension regions can be obtained to effectively restrain the punch-through and the short channel effect. Here, in the aforesaid production method, as shown in FIGS. 21 and 22, a method has been shown in which the pocket injection regions are formed by solid phase diffusion and the extension regions are formed by ion injection (FIGS. 21, 22). However, the pocket injection regions may be formed by ion injection and the extension regions may be formed by solid phase diffusion.

Eighth Embodiment

In the eighth embodiment of the present invention, a method of producing a semiconductor device will be described in which the pocket injection regions are formed at a suitable position to reduce the junction capacitance by forming an elevated layer without forming the elevated semiconductor layers. In the aforesaid first to seventh embodiments, a semiconductor layer elevated above the channel region is formed by selectively growing an epitaxial silicon film 11 on a semiconductor substrate. An effect of reducing the junction capacitance can be obtained even if an elevated structure is formed by a method other than the selective epitaxial film growth.

Figure 23:
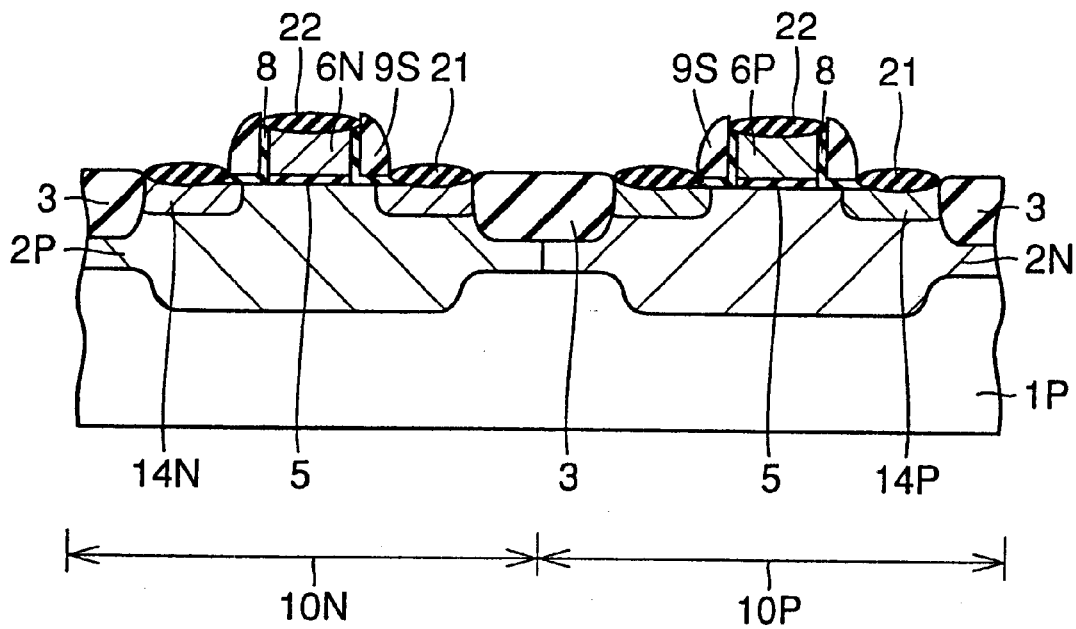
FIG. 23 is a cross section view at a stage in which an upper region of the source/drain regions is oxidized in the eighth embodiment.
Figure 24:
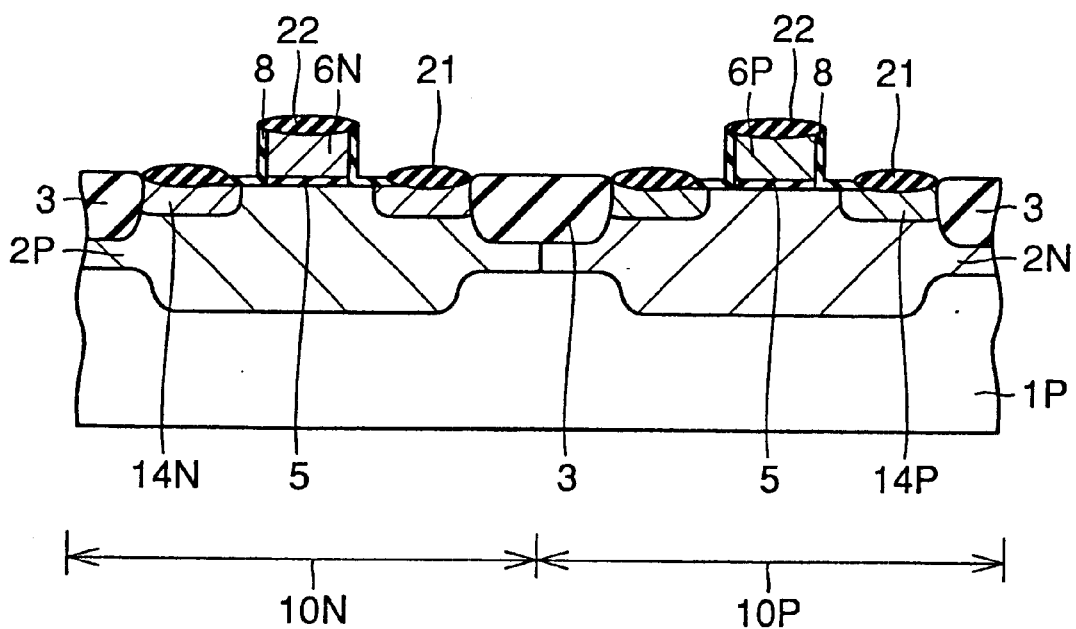
FIG. 24 is a cross section view at a stage in which the side wall spacer is removed after the step of FIG. 23.
Figure 25:
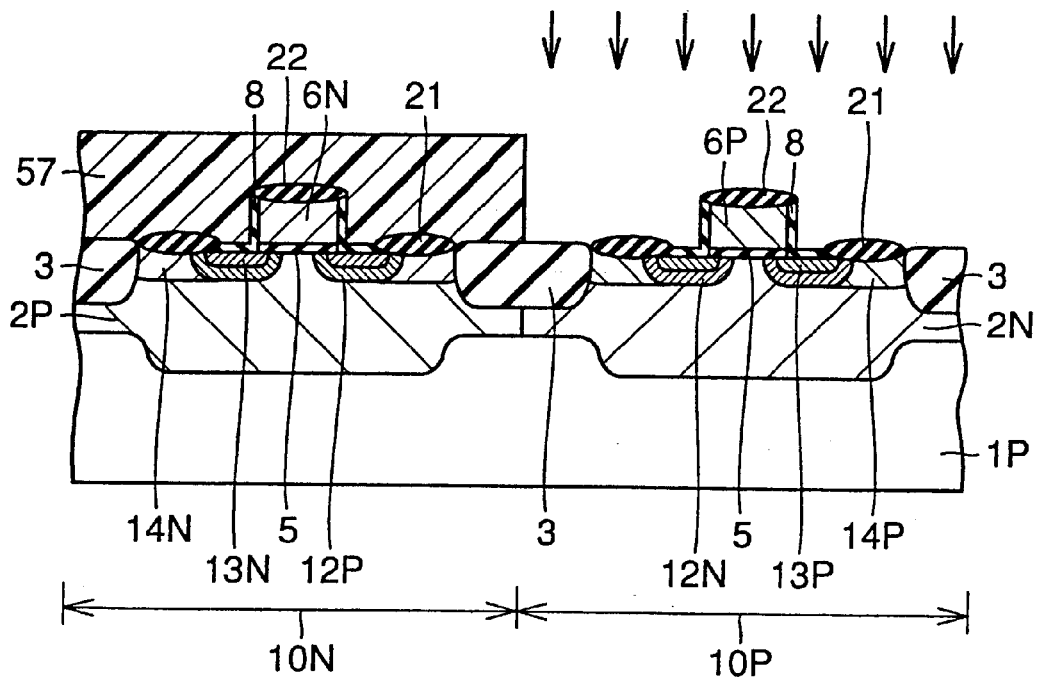
FIG. 25 is a cross section view at a stage in which an n-type pocket injection region and a p-type extension region for a pMOS are formed after the step of FIG. 24.

Ion injection is carried out into a region which is to become source/drain regions in the nMOS and pMOS regions 10N, 10P, followed by an activation heat treatment to form n-type and p-type source/drain regions. Next, by an ordinary method, silicon oxide films 21, 22 are formed by oxidizing the source/drain regions and the gate electrode on which silicon and polysilicon are exposed (FIG. 23). In forming the silicon oxide film, the silicon oxide film is formed to be elevated above the semiconductor substrate surface due to volume expansion. Thereafter, the side wall spacer of silicon nitride film is removed with phosphoric acid or the like (FIG. 24), and ion injection is carried out using boron or boron fluoride into the nMOS region 10N to form an n-type extension region 13N. At this time, the ion injection is carried out through the aforesaid silicon oxide films 21, 22, so that the impurity will not reach a deep position beyond the lower region of the source/drain regions, and the aforesaid-impurity will be contained in the source/drain regions. As a result of this, a junction with the pocket injection regions is not formed on the bottom surface of the source/drain regions, so that the junction capacitance will not be a large value. Next, ion injection using phosphorus, arsenic, antimony, or the like is carried out into the pMOS region 10P to form a p-type extension region 13P (FIG. 25). Thereafter, an activation heat treatment is carried out after the ion injection. During this ion injection, ions are injected through the aforesaid silicon oxide films 21, 22, so that the impurity will not reach a deep position beyond the lower region of the source/drain regions, and the aforesaid impurity will be contained in the source/drain regions. Therefore, the increase of the junction capacitance and others is restrained. Also, the impurity concentration in the lower region of the source/drain regions is canceled to become a low concentration by the impurity injected at the time of forming the aforesaid pocket injection regions. Therefore, the junction capacitance, the junction leakage current, and others are restrained.

According to the aforesaid production method, the junction of the pocket injection regions with the extension regions and the source/drain regions is formed to be small, so that the junction capacitance and the junction leakage current can be restrained. Further, according to the aforesaid production method, there is no need to newly provide a selective epitaxial growth apparatus, and it can be produced using only an apparatus of producing an LSI which has been conventionally used, thereby restraining the rise of production costs.

Ninth Embodiment

Figure 26:
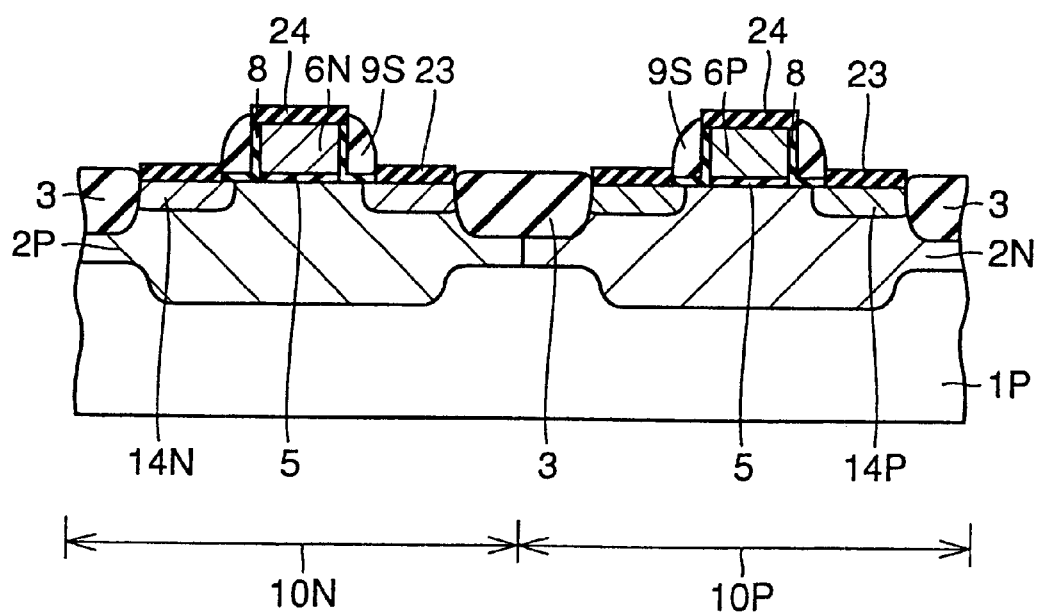
FIG. 26 is a cross section view at a stage in which a metal film is formed on the source/drain regions and the gate region in the ninth embodiment.

In the ninth embodiment of the present invention, a production method will be described in which an elevated-metal film is formed on the semiconductor substrate. Namely, as shown in FIG. 26, metal films 23, 24 may be selectively deposited on the source/drain regions and the gate electrode on which silicon and polysilicon are exposed. By using the aforesaid production method, the parasitic resistance of the source/drain regions and the gate electrode can be reduced.

Tenth Embodiment

Figure 27:
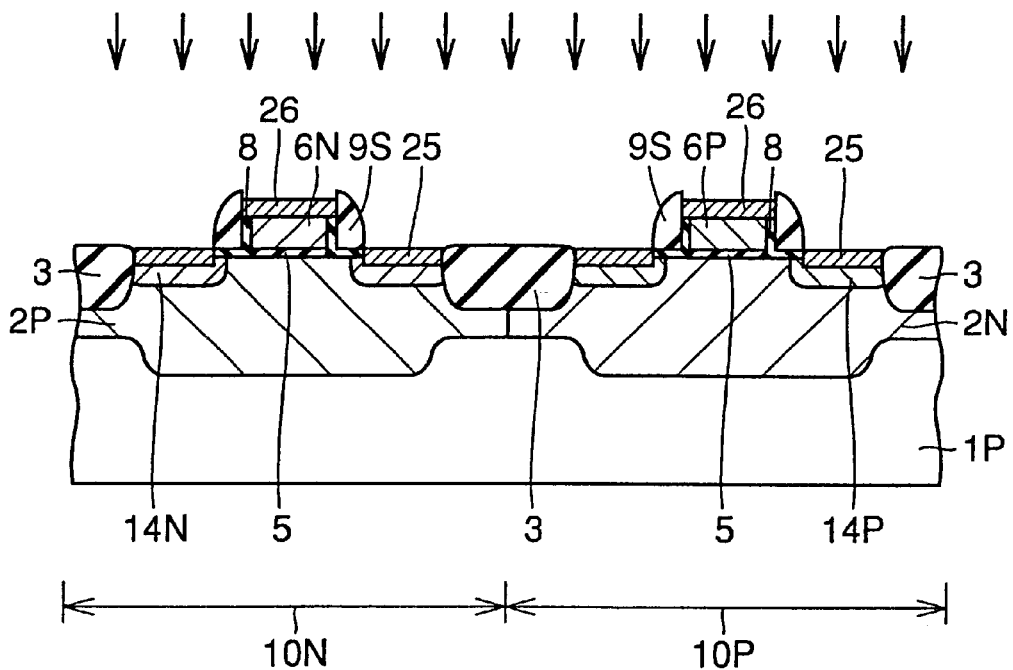
FIG. 27 is a cross section view at a stage in which germanium is injected into an upper layer part of the source/drain regions in the tenth embodiment.
Figure 28:
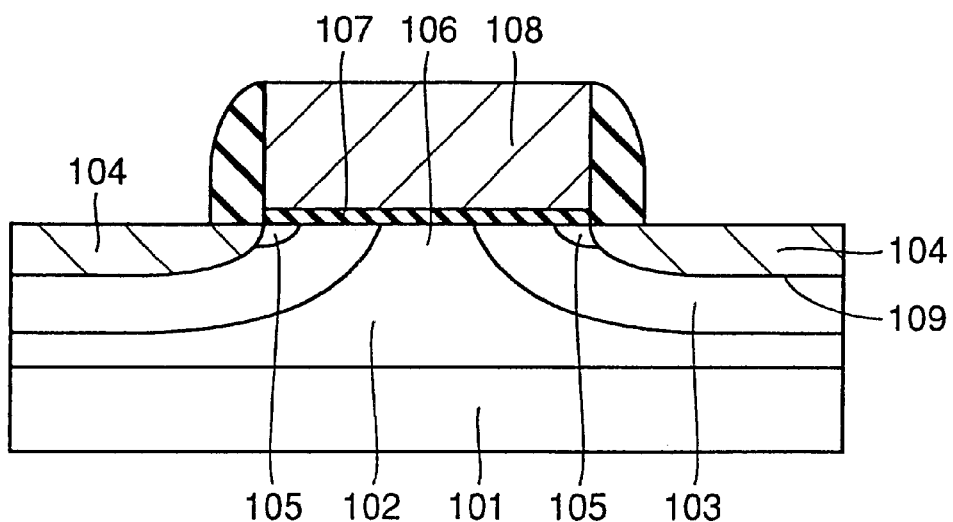
FIG. 28 is a cross section view showing a pocket injection region (NUDC: non-uniformly doped channel) in a conventional semiconductor device.

In the tenth embodiment of the present invention, a production method will be described in which the pocket injection regions are formed only in the neighborhood of the side surface of the source/drain regions without using an elevated structure. Namely, as shown in FIG. 27, if regions 25, 26 in which an element heavier than silicon, for example, germanium is ion-injected at a high concentration (not less than $10^{15}$ cm$^{-2}$) are formed, the projection flight degree of the impurity ion can be made shallow in the subsequent ion injection. For this reason, the distribution of the impurity flying into the source/drain regions can be made shallow in injecting the impurity into the pocket injection regions. Therefore, it is possible to prevent a junction from being formed between the bottom surface of the source/drain regions and the pocket injection regions in the end. As a result of this, the increase of the junction capacitance and the junction leakage current can be restrained.

Eleventh Embodiment

In the eleventh embodiment of the present invention, a method of producing a semiconductor device will be described in which a material constituting the gate electrode is a silicon compound other than polysilicon. In each of the aforesaid first to tenth embodiments, the gate electrode of the CMOS is made of polysilicon. However, the effect of the present invention will not be deteriorated even if the gate electrode is made, for example, of the following material construction.

(a) polycide structure in which a metal silicide film such as tungsten silicide or titanium silicide is disposed in the upper part of polysilicon (b) polymetal structure made of a two-layer structure of a metal such as tungsten and polysilicon (c) multi-layer structure in which barrier metal is inserted between metal and polysilicon In the case of the material construction exemplified above, there is no need to turn the upper part of the gate electrode into silicide, so that the top of the gate electrode may be covered with a dielectric film in turning the source/drain regions into silicide. By using the aforesaid gate electrode structure, a gate electrode having a higher reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a semiconductor device comprising:

forming a gate electrode on a channel region on a surface of a semiconductor region of a semiconductor substrate, the channel region having a depth in said semiconductor substrate;

forming first side wall spacers on opposite sides of said gate electrode;

forming respective elevated semiconductor layers on respective regions on said surface of said semiconductor substrate, each elevated semiconductor layer being elevated relative to said channel region, each region being adjacent a respective first side wall spacer, source and drain regions having a first conductivity type being subsequently formed at the respective regions;

removing said first side wall spacers; and forming a pair of pocket injection regions having a second conductivity type by introducing, into said semiconductor substrate where said first side wall spacers had been present, a dopant impurity producing the second conductivity type, where, said pocket injection regions respectively covering only parts of a neighborhood of respective side surfaces of said channel region where said source and drain regions are to be formed, and forming respective pn junctions only with the parts of the neighborhood of the side surfaces.

2. The method of producing a semiconductor device as set forth in claim 1, including forming said pocket injection regions by introducing the dopant impurity producing the second conductivity type into said semiconductor substrate by ion implantation, using said gate electrode and said elevated semiconductor layers as a mask.

3. The method of producing a semiconductor device as set forth in claim 1, further comprising forming respective source extension and drain extension regions having the first conductivity type and that extend from the regions where the source and drain regions are to be formed, by introducing a dopant impurity producing the first conductivity type into said semiconductor substrate at regions in contact with said pocket injection regions, successively, after forming said pocket injection regions.

4. The method of producing a semiconductor device as set forth in claim 3, further comprising, after forming said source extension and drain extension regions, forming second side wall spacers where said first side wall spacers were located, thereafter introducing a dopant impurity producing the second conductivity type into said semiconductor substrate at the regions where said source and drain regions are to be formed, thereby forming said source and drain regions, and converting parts of said elevated semiconductor layers into a metal silicide.

5. The method of producing a semiconductor device as set forth in claim 3, further comprising, after forming said elevated semiconductor layers and before removing said first side wall spacers, introducing a dopant impurity producing the first conductivity type through said elevated semiconductor layers and into said semiconductor substrate at regions of said semiconductor substrate opposite said elevated semiconductor layers, thereby forming said source and drain regions.

6. The method of producing a semiconductor device as set forth in claim 5, further comprising, after (i) forming said source and drain regions, (ii) removing said first side wall spacers, and (iii) forming said pocket injection regions and said source extension and drain extension regions, forming second side wall spacers where said first side wall spacers had been located, and converting parts of said elevated semiconductor layers into a metal silicide.

7. The method of producing a semiconductor device as set forth in claim 5, further comprising, after forming said source and drain regions and before removing said first side wall spacers, converting parts of said elevated semiconductor layers into a metal suicide.

8. The method of producing a semiconductor device as set forth in claim 1, wherein forming said first side wall spacers comprises forming layers of silicon nitride on respective layers of silicon oxide, the silicon oxide being in contact with side surfaces of said gate electrode.

9. The method of producing a semiconductor device as set forth in claim 1, including forming said pocket injection regions by ion implantation of a dopant impurity at an implantation angle θ relative to a direction perpendicular to the surface of said substrate and not larger than $\tan^{-1}(Ls/Te)$, where Ls=width of said first side walls, and Te=height by which said source and drain regions are elevated relative to said channel region.

10. The method of producing a semiconductor device as set forth in claim 1, including, after removing said first side wall spacers, depositing a deposition layer containing a dopant impurity producing the second conductivity type where the first side wall spacers had been located and heat treating the deposition layer so that the dopant impurity producing the second conductivity type diffuses and is introduced into said semiconductor substrate, forming said pocket injection regions.

11. A method of producing a semiconductor device comprising:

forming a gate electrode on a channel region on a surface of a semiconductor region of a semiconductor substrate, the channel region having a depth in said semiconductor substrate;

forming first side wall spacers on opposite sides of said gate electrode;

forming elevated insulating layers on respective regions on the surface of said semiconductor substrate, each elevated insulating layer being elevated relative to said channel region, each elevated insulating layer being adjacent a respective first side wall spacer on a region of said semiconductor substrate where one of source and drain regions of a first conductivity type are to be formed, said elevated insulator layers being selected from the group consisting of oxide layers and nitride layers;

removing said first side wall spacers; and forming a pair of pocket injection regions having a second conductivity type by introducing into said semiconductor substrate, where said first side wall spacers had been present, a dopant impurity producing the second conductivity type, said pocket injection regions respectively covering only parts of a neighborhood of respective side surfaces of said channel region where said source and drain regions are to be formed, and forming respective pn junctions only with the parts of the neighborhood of the side surfaces.

12. A method of producing a semiconductor device comprising:

forming a gate electrode on a channel region on a surface of a semiconductor region of a semiconductor substrate, the channel region having a depth in said semiconductor substrate;

forming first side wall spacers on opposite sides of said gate electrode;

forming elevated metal layers on respective regions on the surface of said semiconductor substrate, each elevated metal layer being elevated relative to said channel region, each elevated metal layer being adjacent a respective first side wall spacer on regions of said semiconductor substrate where source and drain regions of a first conductivity type are to be formed;

removing said first side wall spacers; and forming a pair of pocket injection regions having a second conductivity type by introducing into said semiconductor substrate, where said first side wall spacers had been present, a dopant impurity producing the second conductivity type, said pocket injection regions respectively covering only parts of a neighborhood of respective side surfaces of said channel region where said source and drain regions are to be formed, and forming respective pn junctions only with the parts of the neighborhood of the side surfaces.

13. A method of producing a semiconductor device comprising:

forming a gate electrode on a channel region on a surface of a semiconductor region of a semiconductor substrate, the channel region having a depth in said semiconductor substrate;

forming, in said substrate, impurity regions doped with a dopant impurity element having a larger atomic weight than an element of said semiconductor substrate, each impurity region being adjacent a respective first side wall spacer on regions of said semiconductor substrate where source and drain regions of a first conductivity type are to be formed;

removing said first side wall spacers; and forming a pair of pocket injection regions having a second conductivity type by introducing into said semiconductor substrate, where said first side wall spacers had been present, a dopant impurity producing the second conductivity type, said pocket injection regions respectively covering only parts of a neighborhood of respective side surfaces of said channel region where said source and drain regions are to be formed, and forming respective pn junctions only with the parts of the neighborhood of the side surfaces.

* * * * *

UNITED STATES PATENT AND TRADEMARK OFFICE
CERTIFICATE OF CORRECTION

PATENT NO. : 6,624,034 B2
DATED : September 23, 2003
INVENTOR(S) : Abe et al.

It is certified that error appears in the above-identified patent and that said Letters Patent is hereby corrected as shown below:

<u>Title page,</u>
Item [30], change "2000-226956" to -- 2000-226959 --.

Signed and Sealed this

Sixteenth Day of March, 2004

JON W. DUDAS
*Acting Director of the United States Patent and Trademark Office*